(12) United States Patent
Lee et al.

(10) Patent No.: US 12,514,080 B2
(45) Date of Patent: Dec. 30, 2025

(54) DISPLAY DEVICE

(71) Applicant: Samsung Display Co., LTD., Yongin-si (KR)

(72) Inventors: Seung Chan Lee, Yongin-si (KR); Jaechung Kim, Yongin-si (KR); Beom Soo Park, Yongin-si (KR); Seong Jun Lee, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 427 days.

(21) Appl. No.: 18/139,725

(22) Filed: Apr. 26, 2023

(65) Prior Publication Data
US 2023/0363219 A1    Nov. 9, 2023

(30) Foreign Application Priority Data

May 4, 2022 (KR) .................. 10-2022-0055440

(51) Int. Cl.
| | |
|---|---|
| *H10K 59/131* | (2023.01) |
| *G02F 1/1333* | (2006.01) |
| *G02F 1/1343* | (2006.01) |
| *G02F 1/136* | (2006.01) |
| *G02F 1/1362* | (2006.01) |
| *G02F 1/1368* | (2006.01) |
| *H10D 86/40* | (2025.01) |

(Continued)

(52) U.S. Cl.
CPC ....... *H10K 59/131* (2023.02); *H10K 59/8791* (2023.02)

(58) Field of Classification Search
CPC .. H10K 59/131; H10K 59/65; H10K 59/1213; G02F 1/136286; G02F 1/133345
See application file for complete search history.

(56) References Cited

U.S. PATENT DOCUMENTS

2016/0118451 A1\* 4/2016 Youn .................. H10D 30/6704
257/66
2018/0308916 A1\* 10/2018 Kim .................. H10K 59/1216
(Continued)

FOREIGN PATENT DOCUMENTS

| KR | 1020180119192 | 11/2018 |
|---|---|---|
| KR | 1020200088953 | 7/2020 |

(Continued)

*Primary Examiner* — Mohsen Ahmadi
(74) *Attorney, Agent, or Firm* — CANTOR COLBURN LLP

(57) ABSTRACT

A display device includes a substrate including a display area and a component area, and first and second signal lines disposed on the substrate, in which each of the display area and the component area includes a first semiconductor layer, a first gate conductive layer and a second gate conductive layer on the first semiconductor layer, a second semiconductor layer on the second gate conductive layer, a third gate conductive layer on the second semiconductor layer, an insulating layer in which openings surrounding the first semiconductor layer, the second gate conductive layer, the second semiconductor layer and the third gate conductive layer are defined, and first and second data conductive layers on the insulating layer, in which the first signal line in the first data conductive layer and the second signal line in the second data conductive layer respectively extend in perpendicular directions.

18 Claims, 24 Drawing Sheets

(51) Int. Cl.
  *H10D 86/60* (2025.01)
  *H10H 29/14* (2025.01)
  *H10K 50/813* (2023.01)
  *H10K 59/121* (2023.01)
  *H10K 59/123* (2023.01)
  *H10K 59/124* (2023.01)
  *H10K 59/35* (2023.01)
  *H10K 59/65* (2023.01)
  *H10K 59/80* (2023.01)

(56) References Cited

U.S. PATENT DOCUMENTS

| | | | | |
|---|---|---|---|---|
| 2018/0366586 | A1 | 12/2018 | Son et al. | |
| 2020/0219962 | A1* | 7/2020 | Park | H10K 59/131 |
| 2021/0126079 | A1* | 4/2021 | Jo | G09G 3/3208 |
| 2021/0335920 | A1* | 10/2021 | Hong | H10K 50/865 |
| 2022/0100346 | A1* | 3/2022 | Kim | H10K 59/131 |
| 2022/0123093 | A1* | 4/2022 | Kim | H10D 86/451 |
| 2022/0367586 | A1* | 11/2022 | Choi | H10D 86/451 |
| 2022/0416006 | A1* | 12/2022 | Choi | G06F 3/0412 |

FOREIGN PATENT DOCUMENTS

| | | |
|---|---|---|
| KR | 1020210024339 | 3/2021 |
| KR | 1020210080686 | 7/2021 |
| KR | 1020210130906 | 11/2021 |

* cited by examiner

DISPLAY DEVICE

This application claims priority to Korean Patent Application No. 10-2022-0055440, filed on May 4, 2022, and all the benefits accruing therefrom under 35 U.S.C. § 119, the content of which in its entirety is herein incorporated by reference.

BACKGROUND (a) Field

Embodiments of the disclosure relate to a display device.

(b) Description of the Related Art

Display devices as devices that display a screen include a liquid crystal display ("LCD"), an organic light-emitting diode ("OLED"), etc. The display devices are used in various electronic devices such as a mobile phone, a navigation, a digital camera, an electronic book, a portable game machine, or various terminals.

The display device such as the OLED may have a structure in which the display device may be bent or folded by a flexible substrate.

Further, an optical element such as a camera or a light sensor is formed in a bezel area which is a periphery of a display area in a small electronic device such as the mobile phone, but technology is developed, in which the camera or the optical sensor may be positioned on a back surface of the display area while a displayed screen is formed with a large size and the size of a peripheral area of the display area is gradually reduced.

SUMMARY

Embodiments of the disclosure have been made in an effort to provide a display device having advantages of reducing reflection of external light in a component area while reducing the influence of an external impact.

An embodiment of the invention provides a display device including a substrate including a display area and a component area, and a plurality of first signal lines and a plurality of second signal lines disposed on the substrate, in which each of the display area and the component area include a first semiconductor layer, a first gate conductive layer and a second gate conductive layer disposed on the first semiconductor layer, a second semiconductor layer disposed on the second gate conductive layer, a third gate conductive layer disposed on the second semiconductor layer, an insulating layer in which openings surrounding the first semiconductor layer, the second gate conductive layer, the second semiconductor layer and the third gate conductive layer are defined, and a first data conductive layer and a second data conductive layer disposed on the insulating layer, in which a first data conductive layer and a second data conductive layer disposed on the insulating layer, the second signal line is included in the second data conductive layer and extends in a second direction perpendicular to the first direction, and the display area includes a first signal line of the plurality of first signal lines and a second signal line of the plurality of second signal lines and the component area includes the first signal line.

In an embodiment, the component area may not include the second signal line.

In an embodiment, in the display area, the first signal line and the second signal line may be electrically connected to each other.

In an embodiment, the first signal line disposed in the display area may include a connection pad portion in contact with the second signal line.

In an embodiment, the first semiconductor layer may include second transistors and fifth transistors, and a first distance between the second transistors spaced apart from each other with the insulating layer therebetween may be greater than a second distance between the fifth transistors spaced apart from each other with the insulating layer therebetween.

In an embodiment, the display device may include a plurality of pixel circuit regions divided by the insulating layer, the second gate conductive layer may include a first storage electrode, a lower second scan line, and a lower initialization control line, and the first storage electrode, the lower second scan line, and the lower initialization control line may be spaced apart from each other by the insulating layer in adjacent pixel circuit regions, respectively, among the plurality of pixel circuit regions.

In an embodiment, the second semiconductor layer may include a third transistor and a fourth transistor, and the third gate conductive layer may include a gate electrode of the third transistor and a gate electrode of the fourth transistor.

In an embodiment, the first data conductive layer may include a second scan line connector connecting the lower second scan lines in the adjacent pixel circuit regions, an initialization connector connecting the lower initialization control lines in the adjacent pixel circuit regions, and a storage electrode connector connecting the first storage electrodes in the adjacent pixel circuit regions.

In an embodiment, the first data conductive layer may include a lower initialization voltage line.

In an embodiment, the second data conductive layer may include an upper initialization voltage line.

In an embodiment, the display area may include the upper initialization voltage line, and the component area may not include the upper initialization voltage line.

In an embodiment, the component area may include a third signal line connecting at least two first signal lines disposed along the second direction.

In an embodiment, the third signal line may connect some of the plurality of first signal lines disposed in the component area.

In an embodiment, the first signal line may be a lower initialization voltage line, and the second signal line may be an upper initialization voltage line.

In an embodiment, the first data conductive layer and the second data conductive layer may transverse the plurality of pixel circuit regions.

In an embodiment, the display device may further include an anode disposed on the second data conductive layer, in which the anode may at least partially overlap with the insulating layer.

Another embodiment of the invention provides a display device including a substrate including a display area and a component area, in which each of the display area and the component area includes a first semiconductor layer, a gate conductive layer disposed on the first semiconductor layer, an insulating layer including openings surrounding the first semiconductor layer and the gate conductive layer, and a data conductive layer disposed on the insulating layer, in which the data conductive layer includes at least one of a first signal line extending in a first direction and a second signal line extending in a second direction perpendicular to the first direction, and the display area includes the first signal line and the second signal line, the component area includes the first signal line, and the second signal line overlaps with the insulating layer in the display area.

In an embodiment, the data conductive layer may include a first data conductive layer and a second data conductive layer disposed in different layers, and the first data conductive layer may include any one of the first signal line and the second signal line, and the second data conductive layer may include the other one of the first signal line and the second signal line.

In an embodiment, the first signal line included in the display area may include a connection pad portion electrically connected to the second signal line.

In an embodiment, the first signal line and the second signal line may receive an initialization voltage or a power supply voltage.

In an embodiment, the first signal line may be provided in plural, the component area may include a plurality of third signal lines connecting first signal lines adjacent along the second direction, and the plurality of third signal lines may be spaced apart from each other along the second direction.

By the embodiments, it is possible to block damage in some areas from propagating to other areas due to an external impact. In addition, it is possible to provide a display device having improved display quality by reducing external light reflection in a component area.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
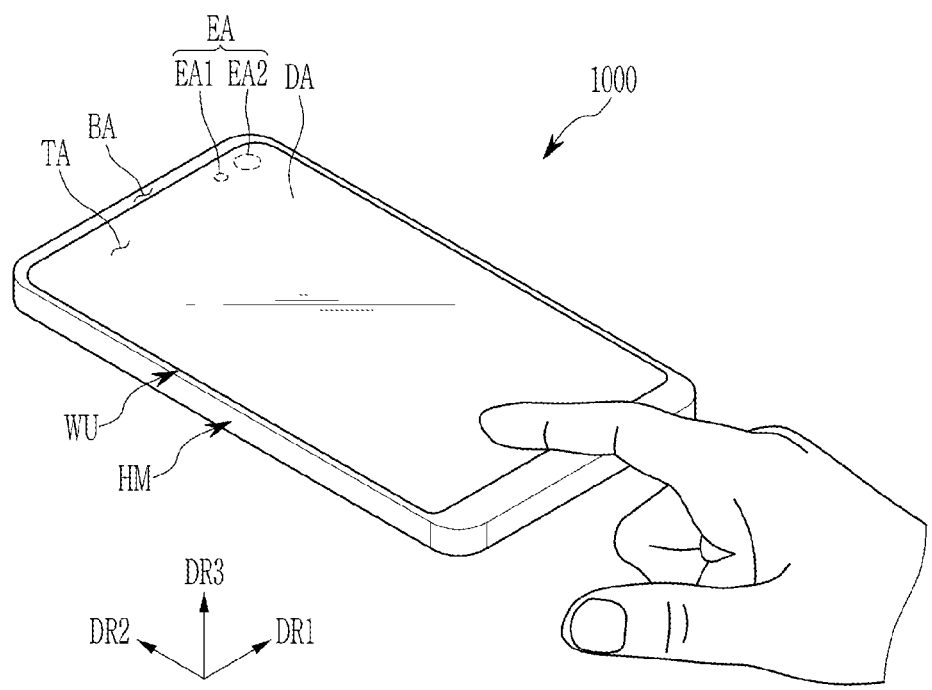
FIG. 1 is a schematic perspective view of an embodiment of a use state of a display device.

Embodiments of the disclosure will be described more fully hereinafter with reference to the accompanying drawings, in which various embodiments of the invention are shown. Embodiments of the disclosure may be implemented in various different forms and is not limited to embodiments described herein.

A part irrelevant to the description will be omitted to clearly describe the invention, and the same elements will be designated by the same reference numerals throughout the specification.

In addition, each configuration illustrated in the drawings is arbitrarily shown for understanding and ease of description, but the invention is not limited thereto. In the drawings, the thickness of layers, layers, panels, regions, etc., are exaggerated for clarity. In addition, in the drawings, for convenience of description, thicknesses of a part and an area are exaggeratedly illustrated.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, to be referred to as "on" or "on" a reference portion is positioned above or below the reference portion and does not particularly mean to "above" or "on" the direction opposite to gravity.

In addition, unless explicitly described to the contrary, the word "comprise", and variations such as "comprises" or "comprising", will be understood to imply the inclusion of stated elements but not the exclusion of any other elements.

In addition, throughout the specification, "in a plan view" means viewing a target part from the top and "in a cross section" means viewing a cross section acquired by vertically cutting the target part from the side.

Further, throughout the specification, "connected" does not mean only a case where two or more components are directly connected but may include a case where two or more components are indirectly connected through another component, a case where two or more components are physically or electrically connected, and a case where respective portions which are referred to as different names according to a position or a function, but are substantially integrated are connected to each other.

Further, throughout the specification, when a portion such as a line, a layer, a film, an area, a plate, a component, etc., "extends in a first direction or a second direction", this does not means only a linear shape which extends straightly in the corresponding direction, and has a structure in which the portion is bent at one portion or a zigzag structure, or a structure in which the portion extends while including a curve structure as a structure in which the portion extends in the first direction or the second direction as a whole.

Further, an electronic device (e.g., a mobile phone, a television ("TV"), a monitor, a notebook computer, etc.) including a display device, a display panel, etc., described in the specification or an electronic device including a display device, a display panel, etc., manufactured by a manufacturing method described in the specification is not also excluded from the scope of this specification.

Figure 2:
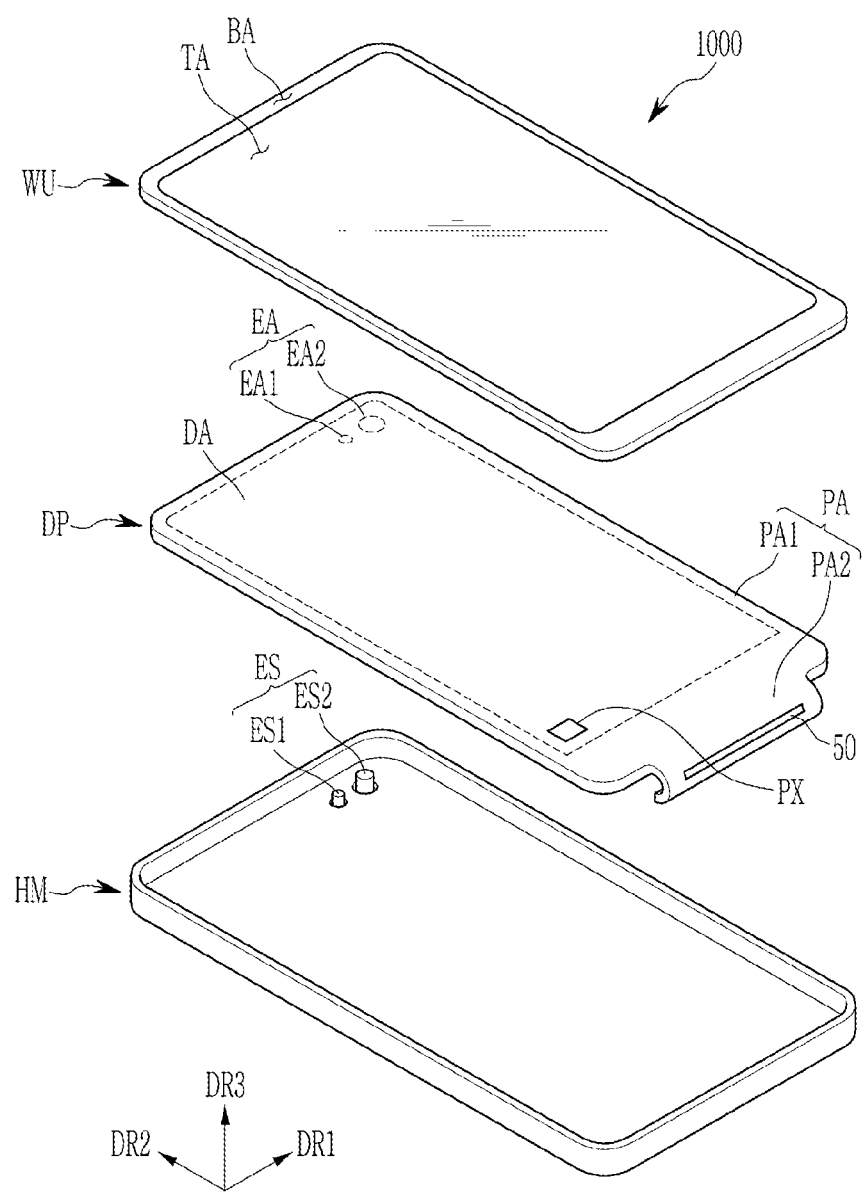
FIG. 2 is an exploded perspective view of an embodiment of the display device.
Figure 3:
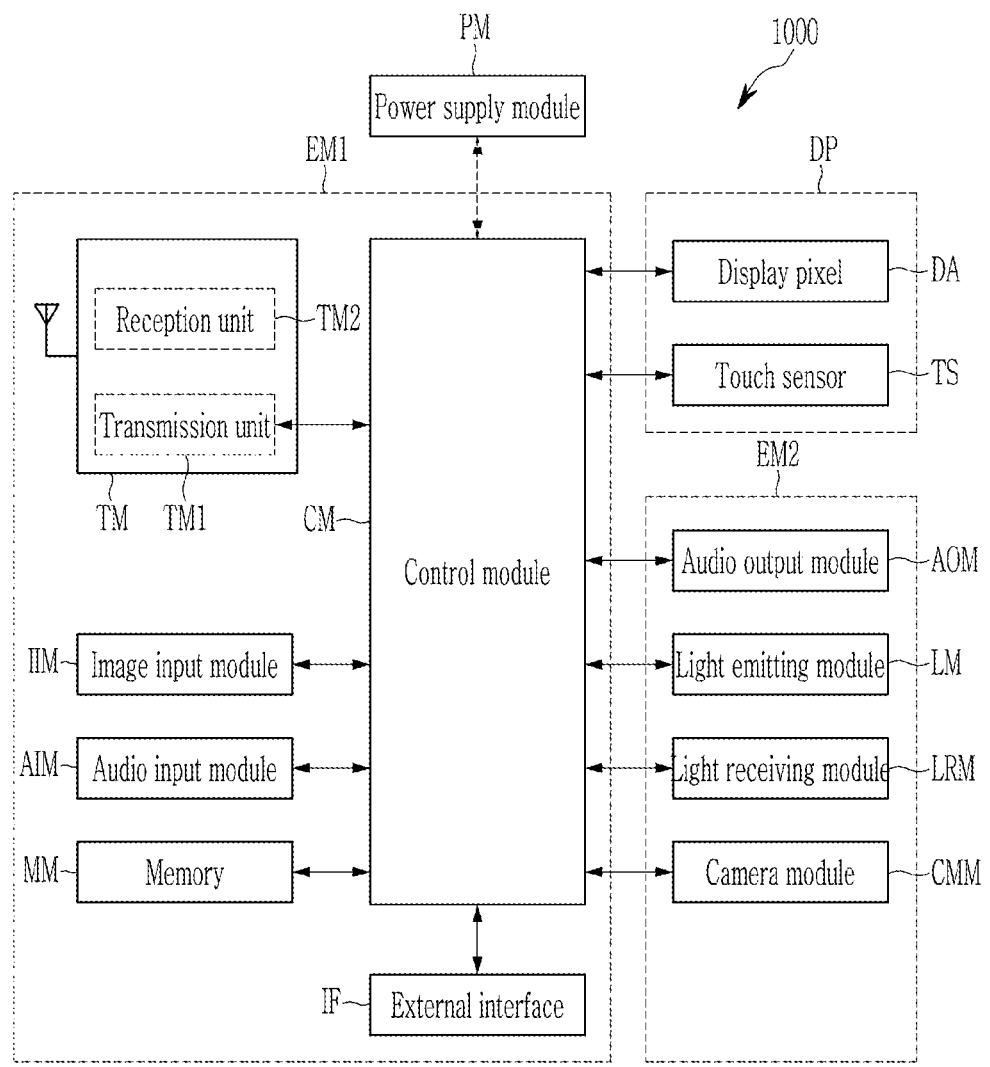
FIG. 3 is a block diagram of an embodiment of the display device.

Hereinafter, a schematic structure of a display device will be described with reference to FIGS. 1 to 3. FIG. 1 is a schematic perspective view of an embodiment of a use state of a display, FIG. 2 is an exploded perspective view of an embodiment of the display device, and FIG. 3 is a block diagram of an embodiment of the display device.

Referring to FIG. 1, a display device 1000 in an embodiment as a device for displaying a moving image or a still image may be used as a display screen of not only portable electronic devices such as a mobile phone, a smart phone, a tablet personal computer ("PC"), a mobile communication terminal, an electronic notebook, an electronic book, a portable multimedia player ("PMP"), a navigation, and a ultra-mobile PC ("UMPC"), but also various products such as a television, a notebook, a monitor, a billboard, and the Internet of Things ("IoT"). Further, the display device 1000 in an embodiment may be used in a wearable device such as a smart watch, a watch phone, a glasses type display, and a head mounted display ("HMD"). Further, the display device 1000 in an embodiment may be used as a dashboard of a car, a center information display ("CID") disposed in a center fascia or a dashboard of the car, a room mirror display which replaces a side mirror of the car, and a display disposed on a back surface of a front seat as an entertainment for a rear seat of the car. FIG. 1 illustrates that the display device 1000 is used as the smart phone for convenience of description.

The display device 1000 may display an image on a display surface parallel to each of a first direction DR1 and a second direction DR2 toward a third direction DR3. The display surface on which the image is displayed may correspond to a front surface of the display device 1000 and correspond to the front surface of a cover window WU. The image may include a still image in addition to a dynamic image.

In the embodiment, a front surface (or top surface) and a back surface (or bottom surface) of each member are defined based on a direction in which the image is displayed. The front surface and the back surface may be opposed to each other in the third direction DR3, and a normal direction of each of the front surface and the back surface may be parallel to the third direction DR3. A spacing distance between the front surface and the back surface in the third direction DR3 may correspond to a thickness of the display panel in the third direction DR3.

The display device 1000 in an embodiment may sense an input (refer to a hand of FIG. 1) of a user applied from the outside. The input of the user may include various types of external inputs such as a part of a user body, light, heat, or pressure. In an embodiment, the input of the user is illustrated as the hand of the user applied to the front surface. However, the invention is not limited thereto. The input of the user may be provided as various types, and further the display device 1000 may also sense the input of the user applied to a side surface or the back surface of the display device 1000 according to the structure of the display device 1000.

Referring to FIGS. 1 and 2, the display device 1000 may include a cover window WU, a housing HM, a display panel DP, and an optical element ES. In an embodiment, the cover window WU and the housing HM are coupled to constitute an exterior of the display device 1000.

The cover window WU may include an insulation panel. In an embodiment, the cover window WU may be constituted by glass, plastic, or any combinations thereof, for example.

The front surface of the cover window WU may define the front surface of the display device 1000. A transmission area TA may be an optically transparent area. In an embodiment, the transmission area TA may be an area having visible ray transmittance of approximately 90% or more, for example.

A blocking area BA may define a shape of the transmission area TA. The blocking area BA may be adjacent to the transmission area TA and surround the transmission area TA. The blocking area BA may be an area having a relatively lower light transmittance than that of the transmission area TA. The blocking area BA may include an opaque substance that blocks light. The blocking area BA may have a predetermined color. The blocking area BA may be defined by a bezel layer provided separately from a transparent substrate defining the transmission area TA or defined by an ink layer formed by insertion or coloring into the transparent substrate.

The display panel DP may include a display panel DP displaying the image and a driving unit 50. The display panel DP may include a front surface including a display area DA and a non-display area PA. The display area DA may be an area in which a pixel operates light to emit light according to an electric signal.

In an embodiment, the display area DA is an area which includes the pixel to display the image, and simultaneously may be an area in which a touch sensor is disposed at an upper side in the third direction DR3 of the pixel to sense the external input.

The transmission area TA of the cover window WU may at least partially overlap with the display area DA of the display panel DP. In an embodiment, the transmission area TA may overlap with the front surface of the display area DA or may at least partially overlap with the display area DA, for example. As a result, a user may view the image through the transmission area TA or provide the external input based on the image. However, the invention is not limited thereto. In an embodiment, an area in which the image is displayed in the display area DA and an area in which the external input is sensed may also be separated from each other, for example.

The non-display area PA of the display panel DP may at least partially overlap with the blocking area BA of the cover window WU. The non-display area PA may be an area covered by the blocking area BA. The non-display area PA may be adjacent to the display area DA and may surround the display area DA. In the non-display area PA, the image is not displayed, and a driving circuit or a driving line for driving the display area DA may be disposed. The non-display area PA may include a first peripheral area PA1 in which the display area DA is disposed outside and a second peripheral area PA2 including the driving unit 50, a connection line, and a bending area. In the embodiment of FIG. 2, the first peripheral area PA1 is disposed at one side of the display area DA and the second peripheral area PA2 is disposed at the remaining one side of the display area DA.

In an embodiment, in the display panel DP, the display area DA and the non-display area PA may be assembled in a flat state facing the cover window WU. However, the invention is not limited thereto. A part of the non-display area PA of the display panel DP may be bent. In this case, a part of the non-display area PA faces the back surface of the display device 1000, so the blocking area BA shown to the front surface of the display device 1000 may be reduced, and in FIG. 2, the second peripheral area PA2 may be bent and disposed on the back surface of the display area DA, and then assembled.

Further, the display panel DP may include a component area EA, and specifically, may include a first component area EA1 and a second component area EA2. The first component area EA1 and the second component area EA2 may be at least partially surrounded by the display area DA. The first component area EA1 and the second component area EA2 are illustrated in the form of being spaced apart from each other but are not limited thereto and may also be at least partially connected. The first component area EA1 and the second component area EA2 may be areas in which a component using visible rays or audio is disposed at a lower portion of the area.

The display area DA includes a plurality of light-emitting diodes, and a plurality of pixels generating and transferring light-emitting current to the plurality of light-emitting diodes, respectively.

The first component area EA1 may include a transmission unit though which light may be transmitted and a second display unit including the plurality of pixels. The transmission unit (OPS in FIGS. 22 to 24) included in the first component area EA1 may have a structure in which a conductive layer or a semiconductor layer is not disposed, and a pixel defining layer, a light-blocking layer, etc., including a light-blocking material define an opening not to block light. The transmission unit (OPS in FIGS. 22 to 24) of the first component area EA1 represents an area in which the conductive layer or the semiconductor layer is not disposed between adjacent pixels. The first component area EA1 may include a second display unit including the plurality of pixels adjacent to the transmission unit (OPS in FIGS. 22 to 24).

The second component area EA2 may include a transmission unit though which light or/and audio may be transmitted and a display unit including the plurality of pixels.

The transmission unit is constituted by a transparent layer which may be disposed between adjacent pixels and transmitted by the light or/and audio. The display unit may have one unit structure by combining the plurality of pixels, and the transmission unit may be disposed between adjacent unit structures.

Here, the each of the display area DA and the first component area EA1 may include the plurality of pixels. A pixel PX includes one light-emitting diode and one pixel circuit unit. One pixel circuit unit and one light-emitting diode are formed in the display area DA and the first component area EA1 one to one.

Referring to FIGS. 1, 2, and 3, the display panel DP may include the display area DA including a display pixel and a touch sensor TS. The display panel DP includes the pixel which is a component generating the image to be viewed by the user externally through the transmission area TA. Further, the touch sensor TS may be disposed above the pixel and may sense the external input applied from the outside. The touch sensor TS may sense the external input provided to the cover window WU.

Referring back to FIG. 2, the second peripheral area PA2 may include a bending portion. The display area DA and the first peripheral area PA1 may have a substantially flat surface parallel to a plane defined by the first direction DR1 and the second direction DR2, and one side of the second peripheral area PA2 may extend from the flat state and have the flat state again by passing through the bending portion. As a result, at least a part of the second peripheral area PA2 may be assembled to be bent and disposed on the back surface of the display area DA. When at least a part of the second peripheral area PA2 is assembled, at least a part of the second peripheral area PA2 overlaps with the display area DA in the plan view, and as a result, the blocking area BA of the display device 1000 may be reduced. However, the invention is not limited thereto. In an embodiment, the second peripheral area PA2 may not also be bent, for example.

The driving unit 50 may be disposed (e.g., mounted) on the second peripheral area PA2 and disposed (e.g., mounted) on the bending portion or disposed at one of opposite sides of the bending portion. The driving unit 50 may be provided in a chip form.

The driving unit 50 is electrically connected to the display area DA to transfer an electric signal to the display area DA.

In an embodiment, the driving unit 50 may provide to pixels PX disposed in the display area DA, for example. In an alternative embodiment, the driving unit 50 may include a touch driving circuit, and may also be electrically connected to the touch sensor TS disposed in the display area DA. The driving unit 50 may include various circuits in addition to the circuits, or may be designed to provide various electric signals to the display area DA.

In the display device 1000, a pad portion may be disposed at an end of the second peripheral area PA2, and electrically connected to a flexible printed circuit board ("FPCB") including a driving chip by the pad portion. Here, the driving chip disposed on the flexible printed circuit board may include various driving circuits for driving the display device 1000 or a connector for supplying power. According to the embodiment, a rigid printed circuit board ("PCB") may be used instead of the flexible printed circuit board.

The optical element ES may be disposed below the display panel DP. The optical element ES may include a first optical element ES1 overlapping with the first component area EA1 and a second optical element ES2 overlapping with the second component area EA2.

The first optical element ES1 may be an electronic element using light or audio. In an embodiment, the first optical element ES1 may be a sensor receiving and using light like an infrared ("IR") sensor, a sensor outputting and sensing the light or audio and measuring a distance or recognizing a fingerprint, a small lamp outputting light, or a speaker outputting sound, for example. In the case of the electronic element using light, light having various wavelength bands, such as visible ray, IR ray, ultraviolet, etc., may be used, of course.

The second optical element ES2 may be at least one of a camera, an IR camera, a dot projector, an IR illuminator, and a time-of-flight ("ToF") sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, the display pixel disposed in the display area DA among the components of the display panel DP and the touch sensor TS are illustrated.

The power supply module PM may supply power desired for an overall operation of the display device 1000. The power supply module PM may include a general battery module.

The first electronic module EM1 and the second electronic module EM2 may include various functional modules for operating the display device 1000. The first electronic module EM1 is disposed (e.g., mounted) directly on a motherboard electrically connected to the display panel DP or disposed (e.g., mounted) on a separate substrate to be electrically connected to the motherboard through a connector (not illustrated).

The first electronic module EM1 may include a control module CM, a wireless communication module TM, an image input module IIM, an audio input module AIM, a memory MM, and an external interface IF. Some of the modules are not disposed (e.g., mounted) on the motherboard and may also be electrically connected to the motherboard through the flexible printed circuit board connected thereto.

The control module CM may control the overall operation of the display device 1000. The control module CM may be a microprocessor. In an embodiment, the control module CM may activate or deactivate the display panel DP, for example. The control module CM may control other modules such as the image input module IIM or the audio input module AIM based on a touch signal received from the display panel DP.

The wireless communication module TM may transmit/receive a radio signal to/from another terminal by a Bluetooth™ or WiFi line. The wireless communication module TM may transmit/receive a voice signal by a general communication line. The wireless communication module TM includes a transmission unit TM1 modulating and transmitting a signal to be transmitted and a reception unit TM2 demodulating a received signal.

The image input module IIM may process an image signal and convert the image signal into image data displayable on the display panel DP. The audio input module AIM may receive an external audio signal by a microphone in a recording mode, a voice recognition mode, or the like, and convert the received audio signal into electrical voice data.

The external interface IF may serve as an interface connected to an external charger, a wired/wireless data port, a card socket (e.g., a memory card, a subscriber identity module/user identification module ("SIM/UIM") card), etc.

The second electronic module EM2 may include an audio output module AOM, a light-emitting module LM, a light-receiving module LRM, and a camera module CMM, and at least some among them as the optical element ES may be disposed on the back surface of the display panel DP as in FIGS. 1 and 2. The optical element ES may include the light-emitting module LM, the light-receiving module LRM, and the camera module CMM. Further, the second electronic module EM2 is disposed (e.g., mounted) directly on the motherboard or disposed (e.g., mounted) on the separate substrate to be electrically connected to the display panel DP through a connector (not illustrated) or electrically connected to the first electronic module EM1.

The audio output module AOM may convert audio data received from the wireless communication module TM or audio data stored in the memory MM and output the audio data to the outside.

The light-emitting module LM may generate and output light. The light-emitting module LM may output the IR ray. In an embodiment, the light-emitting module LM may include an LED element, for example. In an embodiment, the light-receiving module LRM may sense the IR ray, for example. The light-receiving module LRM may be activated when an IR ray at a predetermined level or more is sensed. The light-receiving module LRM may include a complementary metal-oxide-semiconductor ("CMOS") sensor. After IR light generated by the light-emitting module LM is output, the IR light is reflected by an external subject (e.g., a user's finger or face), and the reflected IR light may be incident on the light-receiving module LRM. The camera module CMM may photograph an external image.

In an embodiment, the optical element ES may additionally include a light sensor or a heat sensor. The optical element ES may sense the external subject received through a front surface or provide a sound signal such as voice through the front surface. Further, the optical element ES may also include a plurality of components and is not limited to any one embodiment.

Referring back to FIG. 2, the housing HM may be coupled to the cover window WU. The cover window WU may be disposed on the front surface of the housing HM. The housing HM is coupled to the cover window WU to provide a predetermined accommodation space. The display panel DP and the optical element ES may be accommodated in a predetermined accommodation space provided between the housing HM and the cover window WU.

The housing HM may include a substance having a relatively high rigidity. In an embodiment, the housing HM may include glass, plastic, or metal or include a plurality of frames and/or plates constituted by any combinations thereof, for example. The housing HM may stably protect the components of the display device 1000 accommodated in an internal space from an external shock.

Figure 4:
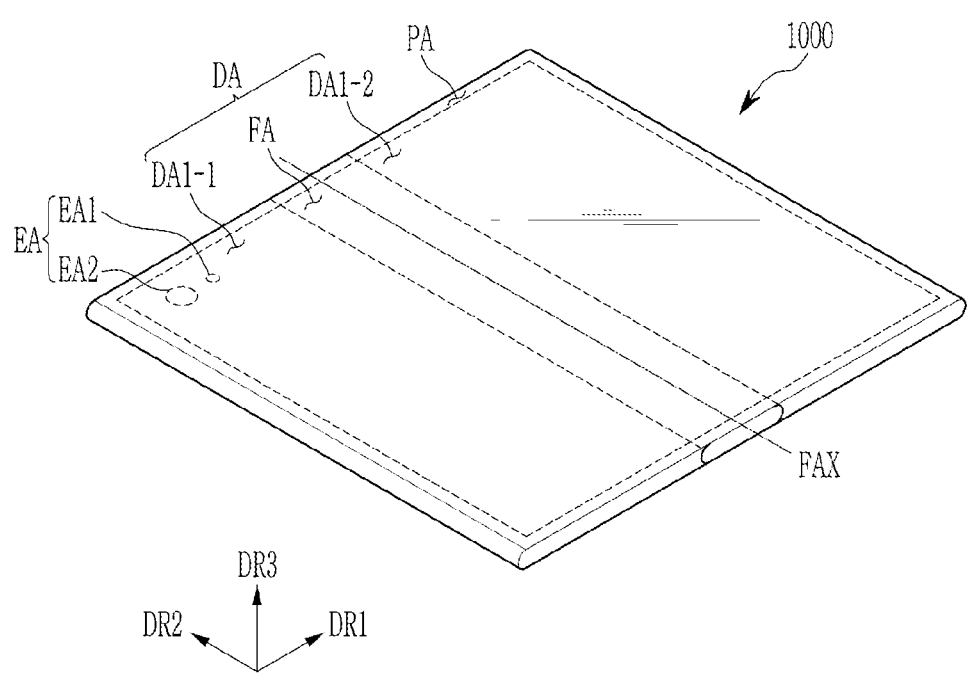
FIG. 4 is a perspective view schematically illustrating another embodiment of a display device.

Hereinafter, a structure of a display device 1000 in another embodiment will be described with reference to FIG. 4. FIG. 4 is a perspective view schematically illustrating an embodiment of a display device. The description of the same configuration as the components will be omitted.

In the embodiment of FIG. 4, a foldable display device having a structure in which a display device 1000 is folded through a folding line FAX.

Referring to FIG. 4, in an embodiment, the display device 1000 may be the foldable display device. The display device 1000 may be folded to the outside or the inside based on a folding axis FAX. When the display device 1000 is folded to the outside based on the folding axis FAX, the display surface of the display device 1000 is disposed at each outer side in the third direction DR3 to display the image in both directions. When the display device 1000 is folded to the inside based on the folding axis FAX, the display surface may not be viewed externally.

In an embodiment, the display device 1000 may include the display area DA, the component area EA, and the non-display area PA. The display area DA may be divided into a 1-1st display area DA1-1, a 1-2nd display area DA1-2, and a folding area FA. The 1-1st display area DA1-1 and the 1-2nd display area DA1-2 may be disposed at a left side and a right side, respectively based on (or around) the folding axis FAX, and the folding area FA may be disposed between the 1-1st display area DA1-1 and the 1-2nd display area DA1-2. In this case, when the display device is folded to the outside based on the folding axis FAX, the 1-1st display area DA1-1 and the 1-2nd display area DA1-2 may be disposed at opposite sides in the third direction DR3 and may display the image in both directions. Further, when the display device to the inside based on the folding axis FAX, the 1-1st display area DA1-1 and the 1-2nd display area DA1-2 may not be viewed externally.

Figure 5:
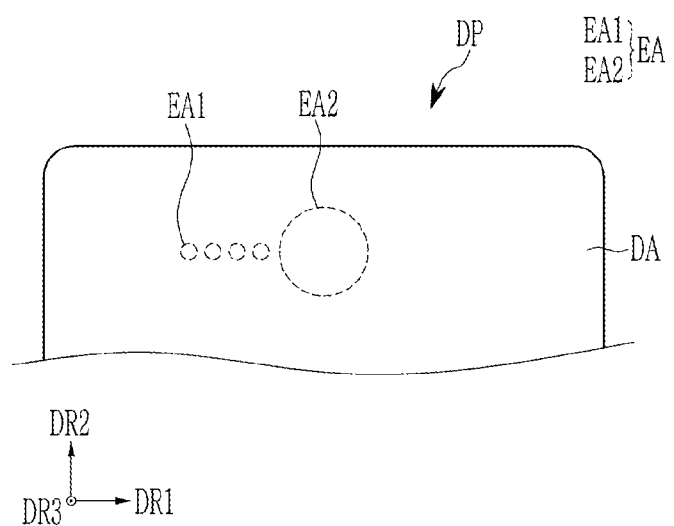
FIG. 5 is a plan view enlarging an embodiment of a partial area of the display device.

FIG. 5 is a plan view enlarging an embodiment of a partial area of the display device. In FIG. 5, a part of the display panel DP in the display device in an embodiment is illustrated.

The display area DA may be disposed on the front surface of the display panel DP and the display panel DP may include the component area EA on the front surface, and specifically, may include the first component area EA1 and the second component area EA2. Additionally, in the embodiment of FIG. 5, the first component area EA1 is disposed at a position adjacent to the second component area EA2. In the embodiment of FIG. 5, the first component area EA1 is disposed at the left side of the second component area EA2. The positions and the number of first component areas EA1 may be diversified for each embodiment. In FIG. 5, an optical element corresponding to the second component area EA2 may be the camera and an optical element corresponding to the first component area EA1 may be the light sensor.

The display panel DP in the embodiment may be largely divided into a lower panel layer and an upper panel layer. The lower panel layer which is a part where the light-emitting diode and the pixel circuit unit are disposed may include even an encapsulation layer (refer to reference numeral 400 in FIG. 24) covering the light-emitting diode and the pixel circuit unit. That is, the lower panel layer includes components from a substrate (refer to reference numeral 110 in FIG. 24) up to the encapsulation layer. The upper panel layer as a part above the encapsulation layer may include sensing insulating films (refer to reference numerals 501, 510, and 511 in FIG. 24) capable of sensing a touch and a plurality of sensing electrodes (refer to reference numerals 540 and 541 in FIG. 24), and include a light-blocking member (refer to reference numeral 220 in FIG. 24), a color filter (refer to reference numeral 230 in FIG. 24), and a planarization layer (refer to reference numeral 550 in FIG. 24).

Although not illustrated in FIG. 5, a peripheral area may be further disposed outside the display area DA. Further, a display panel for a mobile phone is illustrated in FIG. 5, but the embodiment may be applied to a display panel in which the optical element may be disposed on the back surface of the display panel, which may also be the flexible display device. In the case of the foldable display device among the flexible display devices, locations of the second component area EA2 and the first component area EA1 may be formed at different locations from FIG. 5.

Figure 6:
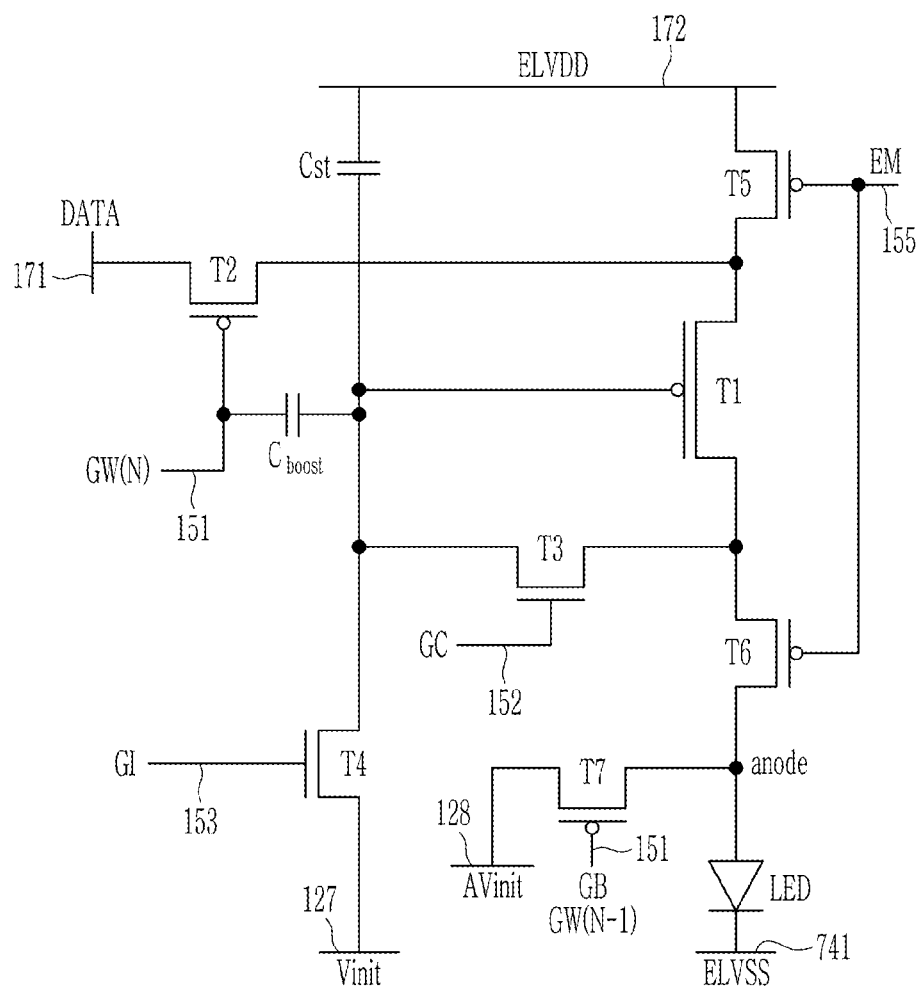
FIG. 6 is a circuit diagram of an embodiment of one pixel included in the display device.

Hereinafter, a circuit structure of a pixel disposed on the lower panel layer of the display area DA and the component area EA will be described in detail with reference to FIG. 6. FIG. 6 is a circuit diagram of an embodiment of one pixel included in the display device.

One pixel in an embodiment includes a plurality of transistors T1, T2, T3, T4, T5, T6, and T7 connected to multiple lines 127, 128, 151, 152, 153, 155, 171, 172, and 741, a storage capacitor Cst, a boost capacitor $C_{boost}$, and a light-emitting diode LED. Here, the transistor and the capacitor except for the light-emitting diode LED constitute the pixel circuit unit. In some embodiments, the boost capacitor $C_{boost}$ may be omitted.

The plurality of lines 127, 128, 151, 152, 153, 155, 171, 172, and 741 is connected to one pixel PX. The plurality of lines includes a first initialization voltage line 127, a second initialization voltage line 128, a first scan line 151, a second scan line 152, an initialization control line 153, a light-emitting control line 155, a data line 171, a driving voltage line 172, and a common voltage line 741. The first scan line 151 connected to a seventh transistor T7 is connected even to a second transistor T2, but in some embodiments, the seventh transistor T7 may also be connected to a separate bypass control line unlike the second transistor T2.

The first scan line 151 is connected to a scan driving unit (not illustrated) and transfers a first scan signal GW(N) to the second transistor T2. The first scan line 151 at a previous stage transfers a first scan signal GW(N−1) at a previous stage to the seventh transistor T7. Voltage having an opposite polarity to voltage applied to the first scan line 151 may be applied to the second scan line 152 at the same timing as a signal of the first scan line 151. In an embodiment, when voltage having a negative polarity is applied to the first scan line 151, voltage having a positive polarity may be applied to the second scan line 152, for example. The second scan line 152 transfers a second scan signal GC to a third transistor T3. The initialization control line 153 transfers an initialization control signal GI to a fourth transistor T4. The light-emitting control line 155 transfers a light-emitting control signal EM to a fifth transistor T5 and a sixth transistor T6.

The data line 171 is a line that transfers data voltage DATA generated by the data driving unit (not illustrated), and as a result, a magnitude of light-emitting current transferred to the light-emitting diode LED is changed and converted into luminance with which the light-emitting diode LED emits light. The driving voltage line 172 applies driving voltage ELVDD. The first initialization voltage line 127 transfers first initialization voltage Vinit and the second initialization voltage line 128 transfers second initialization voltage AVinit. The common voltage line 741 applies common voltage ELVSS to a cathode of the light-emitting diode LED. In the embodiment, voltage applied to each of the driving voltage line 172, the first and second initialization voltage lines 127 and 128, and the common voltage line 741 may be constant voltage.

A driving transistor T1 (or also referred to as first transistor) as a p type transistor has a silicon semiconductor as a semiconductor layer. The driving transistor is a transistor that adjusts the magnitude of the light-emitting current output to an anode of the light-emitting diode LED according to the magnitude of voltage (i.e., voltage stored in the storage capacitor Cst) of a gate electrode of the driving transistor T1. Since brightness of the light-emitting diode LED is adjusted according to the magnitude of the light-emitting current output to the anode electrode of the light-emitting diode LED, light-emitting luminance of the light-emitting diode LED may be adjusted according to the data voltage DATA applied to the pixel. To this end, a first electrode of the driving transistor T1 is disposed to receive the driving voltage ELVDD and connected to the driving voltage line 172 via the fifth transistor T5. Further, the first electrode of the driving transistor T1 is also connected to a second electrode of the second transistor T2 to be applied even with the data voltage DATA. The second electrode of the driving transistor T1 outputs the light-emitting current to the light-emitting diode LED and is connected to an anode of the light-emitting diode LED via a sixth transistor T6 (hereinafter, also referred to output control transistor). Further, the second electrode of the driving transistor T1 is also connected to the third transistor T3 to transfer the data voltage DATA applied to the first electrode to the third transistor T3. The gate electrode of the driving transistor T1 is connected to one electrode (hereinafter, also referred to as 'second storage electrode') of the storage capacitor Cst. Therefore, the voltage of the gate electrode of the driving transistor T1 is changed according to the voltage stored in the storage capacitor Cst, and as a result, the light-emitting current output by the driving transistor T1 is changed. The storage capacitor Cst serves to constantly maintain the voltage of the gate electrode of the driving transistor T1 during one frame. The gate electrode of the driving transistor T1 is also connected to the third transistor T3 to transfer the data voltage DATA applied to the first electrode of the driving transistor T1 to the gate electrode of the driving transistor T1 via the third transistor T3. The gate electrode of the driving transistor T1 is also connected to the fourth transistor T4 and receives the first initialization voltage Vinit to be initialized.

The second transistor T2 as the p type transistor has the silicon semiconductor as the semiconductor layer. The second transistor T2 is a transistor that receives the data voltage DATA within the pixel. The gate electrode of the second transistor T2 is connected to the first scan line 151 and one electrode (hereinafter, also referred to as 'lower boost electrode') of the boost capacitor $C_{boost}$. The first electrode of the second transistor T2 is connected to the data line 171. The second electrode of the second transistor T2 is connected to the first electrode of the driving transistor T1. When the second transistor T2 is turned on by the negative-polarity voltage in the first scan signal GW(N) transferred through the first scan line 151, the data voltage DATA transferred through the data line 171 is transferred to the first electrode of the driving transistor T1, and finally, the data voltage DATA is transferred to the gate electrode of the driving transistor T1 and stored in the storage capacitor Cst.

The third transistor T3 as an n type transistor has an oxide semiconductor as the semiconductor layer. The third transistor T3 electrically connects the second electrode of the driving transistor T1 and the gate electrode of the driving transistor T1. As a result, the third transistor T3 is a transistor which compensates the data voltage DATA as large as threshold voltage of the driving transistor T1, and then stores the data voltage in the second storage electrode of the storage capacitor Cst. The gate electrode of the third transistor T3 is connected to the second scan line 152 and the first electrode of the third transistor T3 is connected to the second electrode of the driving transistor T1. The second electrode of the third transistor T3 is connected to the second storage electrode of the storage capacitor Cst, the gate electrode of the driving transistor T1, and the other electrode (hereinafter, also referred to as 'upper boost electrode) of the boost capacitor $C_{boost}$. The third transistor T3 is turned on by the positive-polarity voltage in the second scan signal GC transferred through the second scan line 152 to connect the gate electrode of the driving transistor T1 and the second electrode of the driving transistor T1, and transfers the voltage applied to the gate electrode of the driving transistor T1 to the second storage electrode of the storage capacitor Cst and store the voltage in the storage capacitor Cst. In this case, the voltage stored in the storage capacitor Cst is stored in a state in which the voltage of the gate electrode of the driving transistor T1 when the driving transistor T1 is turned off and a threshold voltage Vth value of the driving transistor T1 is compensated.

The fourth transistor T4 as the n type transistor has the oxide semiconductor as the semiconductor layer. The fourth transistor T4 serves to initialize the gate electrode of the driving transistor T1 and the second storage electrode of the storage capacitor Cst. The gate electrode of the fourth transistor T4 is connected to the initialization control line 153 and the first electrode of the fourth transistor T4 is connected to the first initialization voltage line 127. The second electrode of the fourth transistor T4 is connected to the second electrode of the third transistor T3, the second storage electrode of the storage capacitor Cst, the gate electrode of the driving transistor T1, and an upper boost electrode of the boost capacitor $C_{boost}$. The fourth transistor T4 is turned on by the positive-polarity voltage among the initialization control signal GI transferred through the initialization control line 153, and in this case, transfers the initialization voltage Vinit to the gate electrode of the driving transistor T1, the second storage electrode of the storage capacitor Cst, and the upper boost electrode of the boost capacitor $C_{boost}$ and initializes the electrodes.

The fifth transistor T5 and the sixth transistor T6 as the p type transistors have the silicon semiconductor as the semiconductor layer.

The fifth transistor T5 serves to transfer the driving voltage ELVDD to the driving transistor T1. The gate electrode of the fifth transistor T5 is connected to the light-emitting control line 155, the first electrode of the fifth transistor T5 is connected to the driving voltage line 172, and the second electrode of the fifth transistor T5 is connected to the first electrode of the driving transistor T1.

The sixth transistor T6 serves to transfer the light-emitting current output from the driving transistor T1 to the light-emitting diode LED. The gate electrode of the sixth transistor T6 is connected to the light-emitting control line 155, the first electrode of the sixth transistor T6 is connected to the second electrode of the driving transistor T1, and the second electrode of the sixth transistor T6 is connected to the anode of the light-emitting diode LED.

The seventh transistor T7 as the p type or n type transistor has the silicon semiconductor or the oxide semiconductor as the semiconductor layer. The seventh transistor T7 serves to initialize the anode of the light-emitting diode LED. The gate electrode of the seventh transistor T7 is connected to the first scan line 151 of the previous stage, the first electrode of the seventh transistor T7 is connected to the anode of the light-emitting diode LED, and the second electrode of the seventh transistor T7 is connected to the second initialization voltage line 128. When the seventh transistor T7 is turned on by the negative-polarity voltage in the first scan line 151, the second initialization voltage AVinit is applied to the anode of the light-emitting diode LED, which is initialized. The gate electrode of the seventh transistor T7 may be connected to a separate bypass control line and controlled by a separate line from the first scan line 151. Further, in some embodiments, the second initialization voltage line 128 to which the second initialization voltage AVinit is applied may be the same as the first initialization voltage line 127 to which the first initialization voltage Vinit is applied.

It is described that one pixel PX includes seven transistors T1 to T7 and two capacitors (the storage capacitor Cst and the boost capacitor $C_{boost}$), but the invention is not limited thereto, and in some embodiments, the boost capacitor $C_{boost}$ may be excluded. Further, this is the embodiment in which the third transistor and the fourth transistor are formed as the n type transistors, but only one of both transistors may be formed as the n type transistor or the other transistor (e.g., the seventh transistor) may be formed as the n type transistor.

Hereinabove, the circuit structure of the pixel which is formed in the display area DA and the second component area EA2 has been described.

Figure 7:
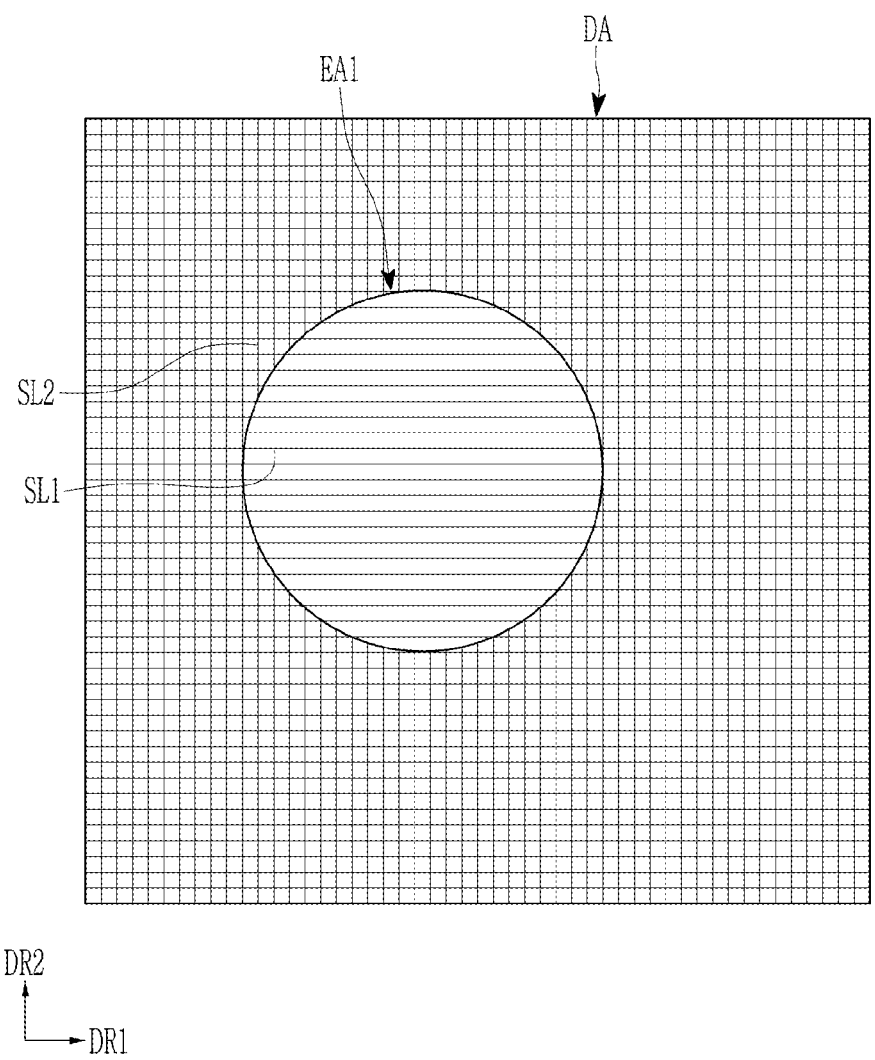
FIGS. 7 and 8 are plan views of an embodiment of lines in a component area, respectively.
Figure 8:
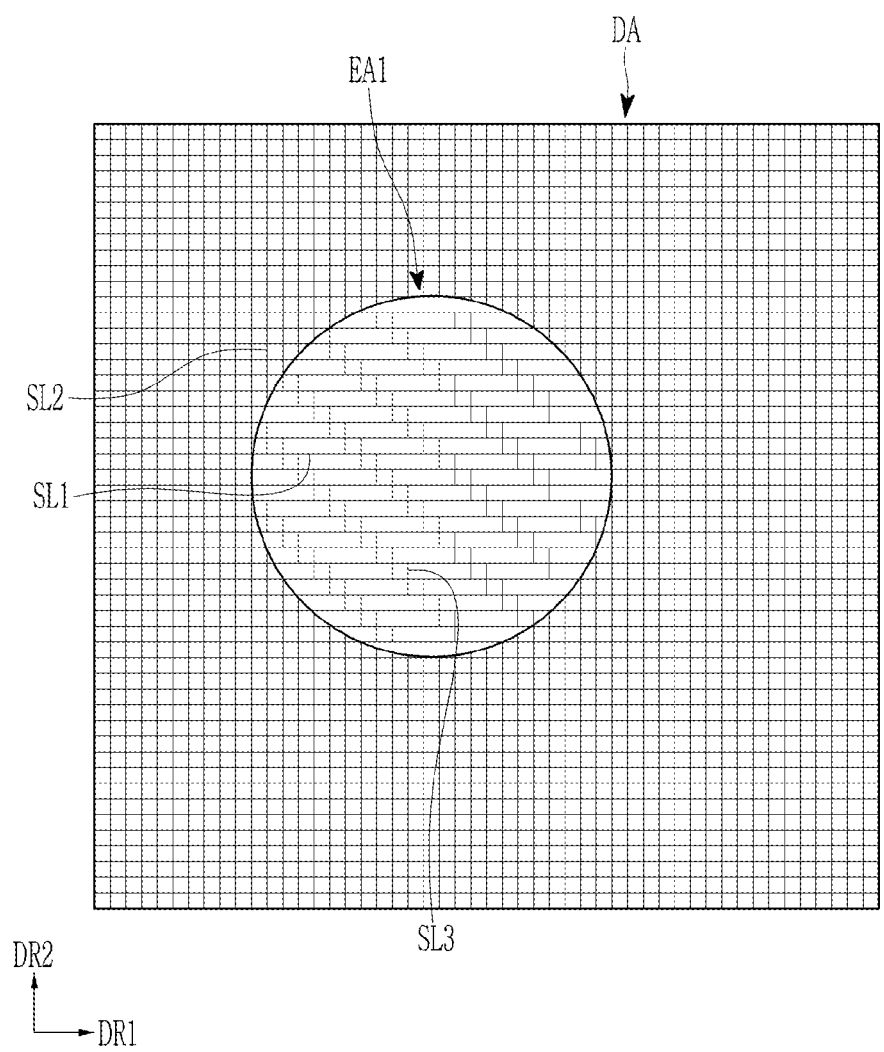

FIGS. 7 and 8 are plan views of an embodiment of signal lines in a display area and a component area, respectively.

First, referring to FIG. 7, the display panel in an embodiment may include a first signal line SL1 and a second signal line SL2 disposed in the display area DA and the first component area EA1. The first signal line SL1 and the second signal line SL2 may be disposed in different layers or disposed in the same layer.

The first signal line SL1 may substantially extend in the first direction DR1 and the second signal line SL2 may substantially extend in the second direction DR2. The first signal line SL1 and the second signal line SL2 may have a mesh form. The first signal line SL1 may be disposed while crossing the display area DA and the first component area EA1. The second signal line SL2 may be disposed in the display area DA and spaced apart from the first component area EA1. The second signal line SL2 may not overlap with the first component area EA1. The optical element is disposed in the first component area EA1, and the second signal line SL2 which extends in the second direction DR2 is omitted to reduce reflection by external light and enhance the transmittance.

The first signal line SL1 and the second signal line SL2 may be electrically connected to each other and applied with the same voltage. In an embodiment, the first signal line SL1 and the second signal line SL2 may be applied with first initialization voltage, or applied with second initialization voltage, or applied with power voltage, and the invention is not limited thereto.

In an embodiment, the second signal line SL2 may include at least one of the common voltage line, the first initialization voltage line, and the second initialization voltage line. At least one of the common voltage line, the first initialization voltage line, and the second initialization voltage line included in the second signal line SL2 may be removed from the first component area EA1. In an embodiment, the common voltage disposed in the first component area EA1 may be removed, and the first initialization voltage line and the second initialization voltage line may be disposed in the first component area EA1. In an alternative embodiment, the first initialization voltage line disposed in the first component area EA1 may be removed, and the common voltage and the second initialization voltage line may be disposed in the first component area EA1. In an alternative embodiment, the second initialization voltage line disposed in the first component area EA1 may be removed, and the first initialization voltage line and the common voltage may be disposed in the first component area EA1. In an alternative embodiment, the common voltage and the first initialization voltage line disposed in the first component area EA1 may be removed, and the second initialization voltage line may be disposed in the first component area EA1. In an alternative embodiment, the common voltage and the second initialization voltage line disposed in the first component area EA1 may be removed, and the first initialization voltage line may be disposed in the first component area EA1. In an alternative embodiment, the first initialization voltage line and the second initialization voltage line disposed in the first component area EA1 may be removed, and the common voltage may be disposed in the first component area EA1. In an alternative embodiment, in some embodiments, the common voltage line, the first initialization voltage line, and the second initialization voltage line disposed in the first component area EA1 may be all removed. Next, referring to FIG. 8, the display panel in an embodiment may include the first signal line SL1, the second signal line SL2, and a third signal line SL3 disposed in the display area DA and the first component area EA1. The first signal line SL1, the second signal line SL2, and the third signal SL3 may be disposed in different layers or at least a part may be disposed in the same layer.

The first signal line SL1 may substantially extend in the first direction DR1, the second signal line SL2 may substantially extend in the second direction DR2, and the third signal line SL3 may substantially extend in the second direction DR2. The first signal line SL1 and the second signal line SL2 may have the mesh form in the display area DA. The first signal line SL1 may be disposed while crossing the display area DA and the first component area EA1. The second signal line SL2 may be disposed in the display area DA and spaced apart from the first component area EA1. The second signal line SL2 may not overlap with the first component area EA1. The third signal line SL3 may be disposed in the first component area EA1. The third signal line SL3 may connect at least two of a plurality of first signal lines SL1 spaced apart from each other in the second direction DR2 in the first component area EA1. The third signal line SL3 may connect some of the plurality of first signal lines SL1 spaced apart from each other to each other in the second direction DR2 in the first component area EA1. The optical element is disposed in the first component area EA1, and the second signal line SL2 which crosses the first component area EA1 in the second direction DR2 is omitted to reduce reflection by external light and enhance the transmittance. Further, a display device may be provided, in which some first signal lines SL1 are connected through the third signal line SL3 to prevent voltage drop and enhance a display quality.

The first signal line SL1, the second signal line SL2, and the third signal line SL3 may be electrically connected to each other and applied with the same voltage. In an embodiment, the first signal line SL1, the second signal line SL2, and the third signal line SL3 may be applied with the first initialization voltage, or applied with the second initialization voltage, or applied with power voltage, and the invention is not limited thereto.

Figure 20:
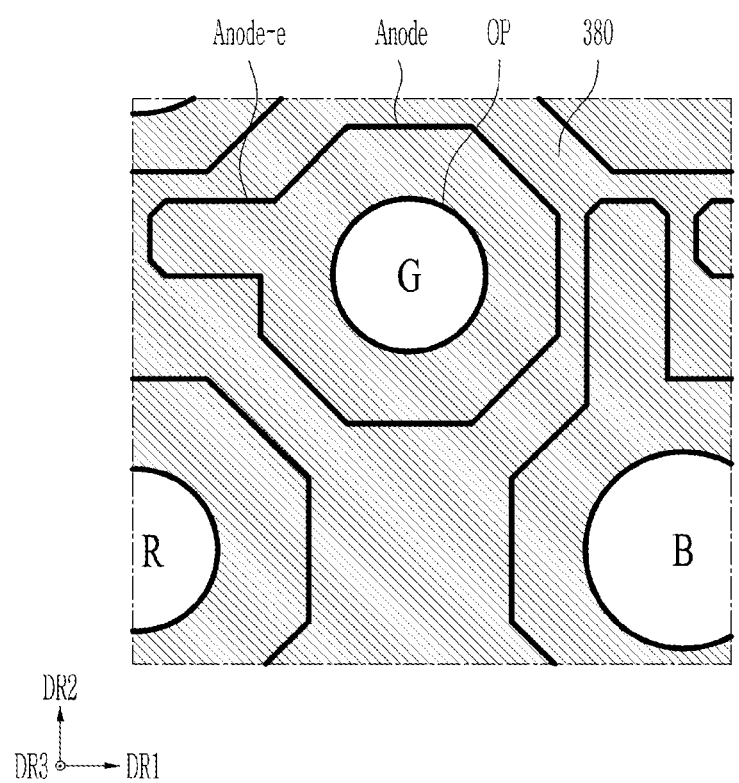
FIG. 20 is a plan view illustrating an opening of a barrier and an anode disposed on the second data conductive layer of FIG. 19.
Figure 21:
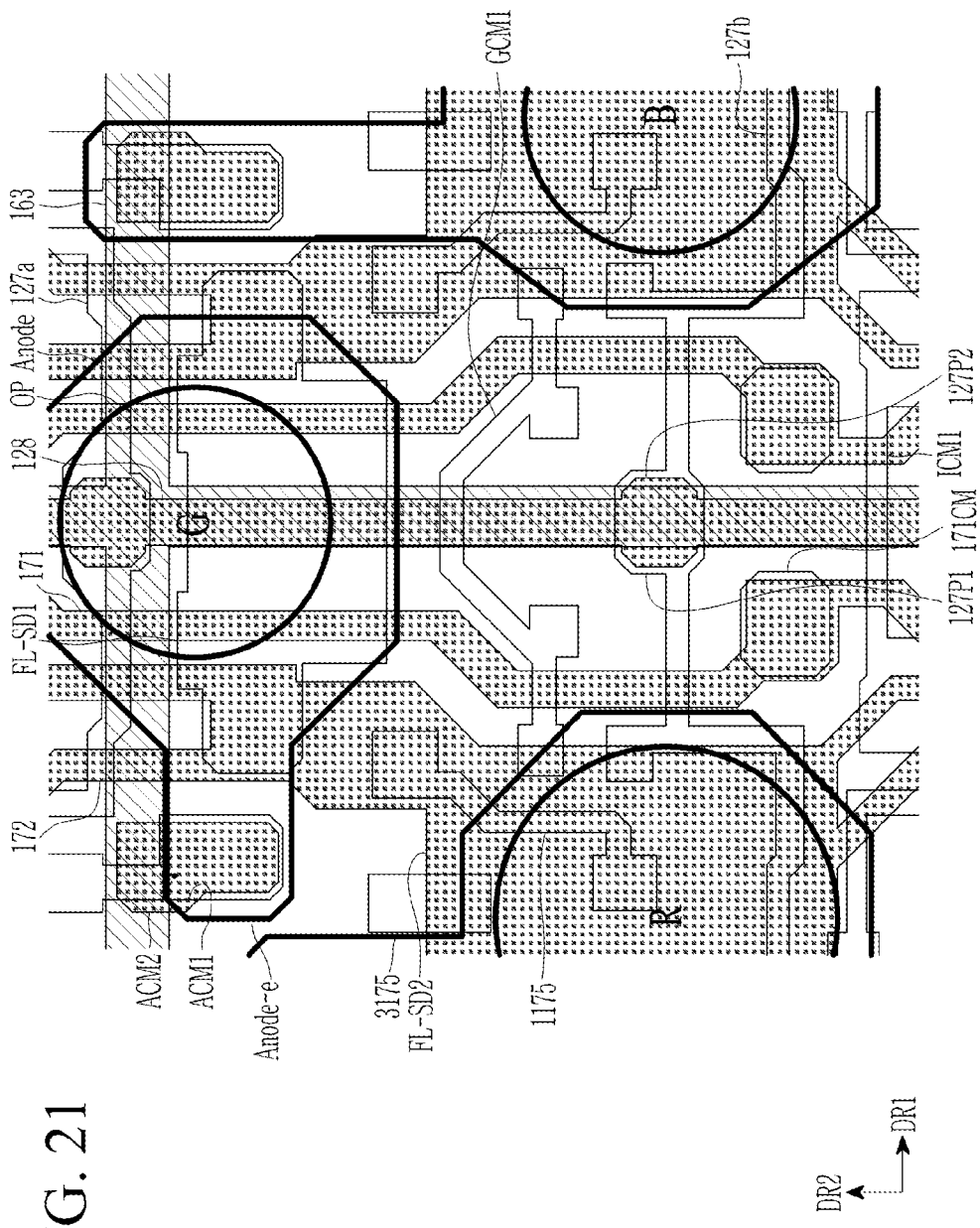
FIG. 21 is a plan view illustrating the first data conductive layer and the opening of the barrier on the second data conductive layer.
Figure 22:
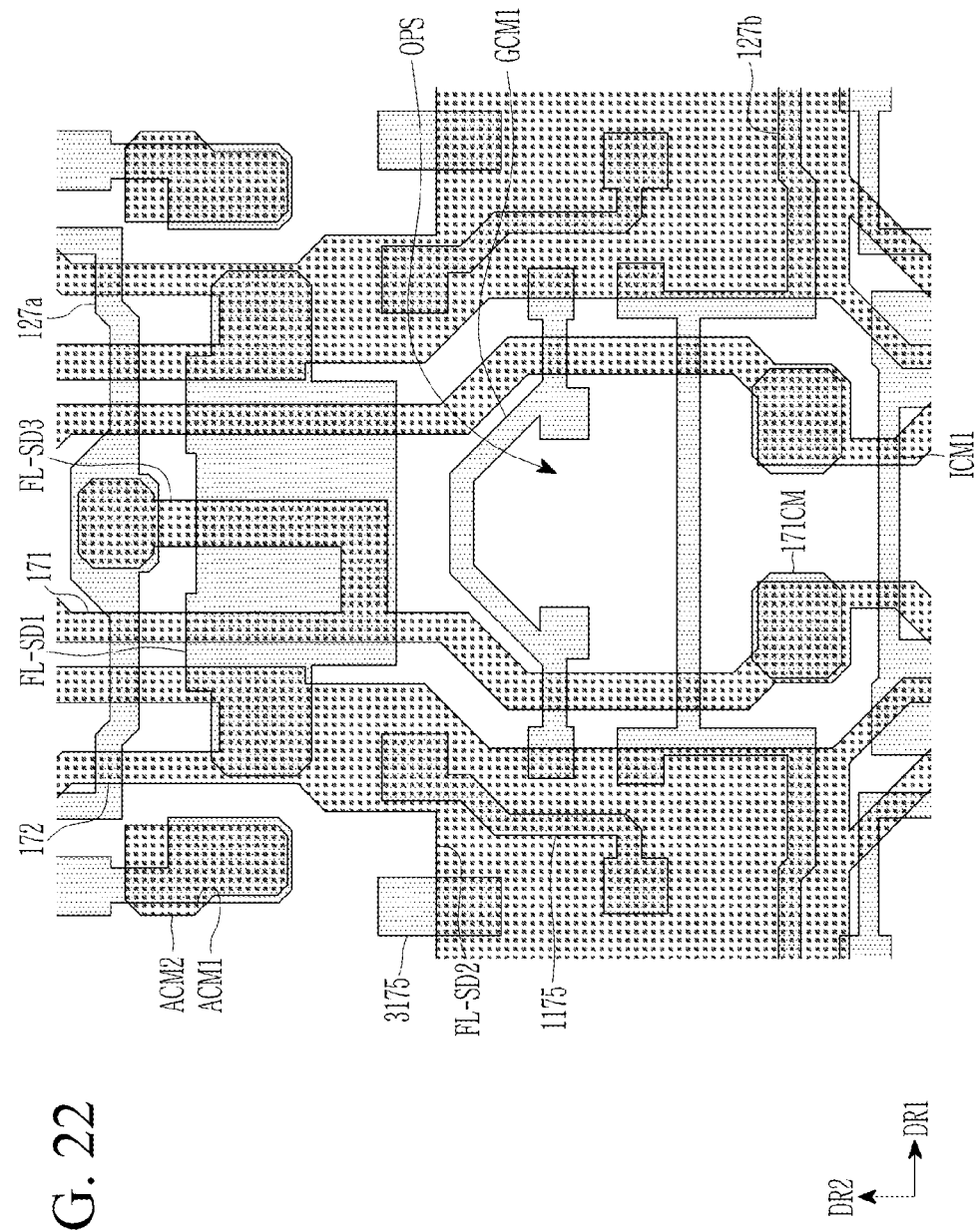
FIGS. 22 and 23 are plan views of the first data conductive layer and the second data conductive layer disposed in the component area, respectively.
Figure 23:
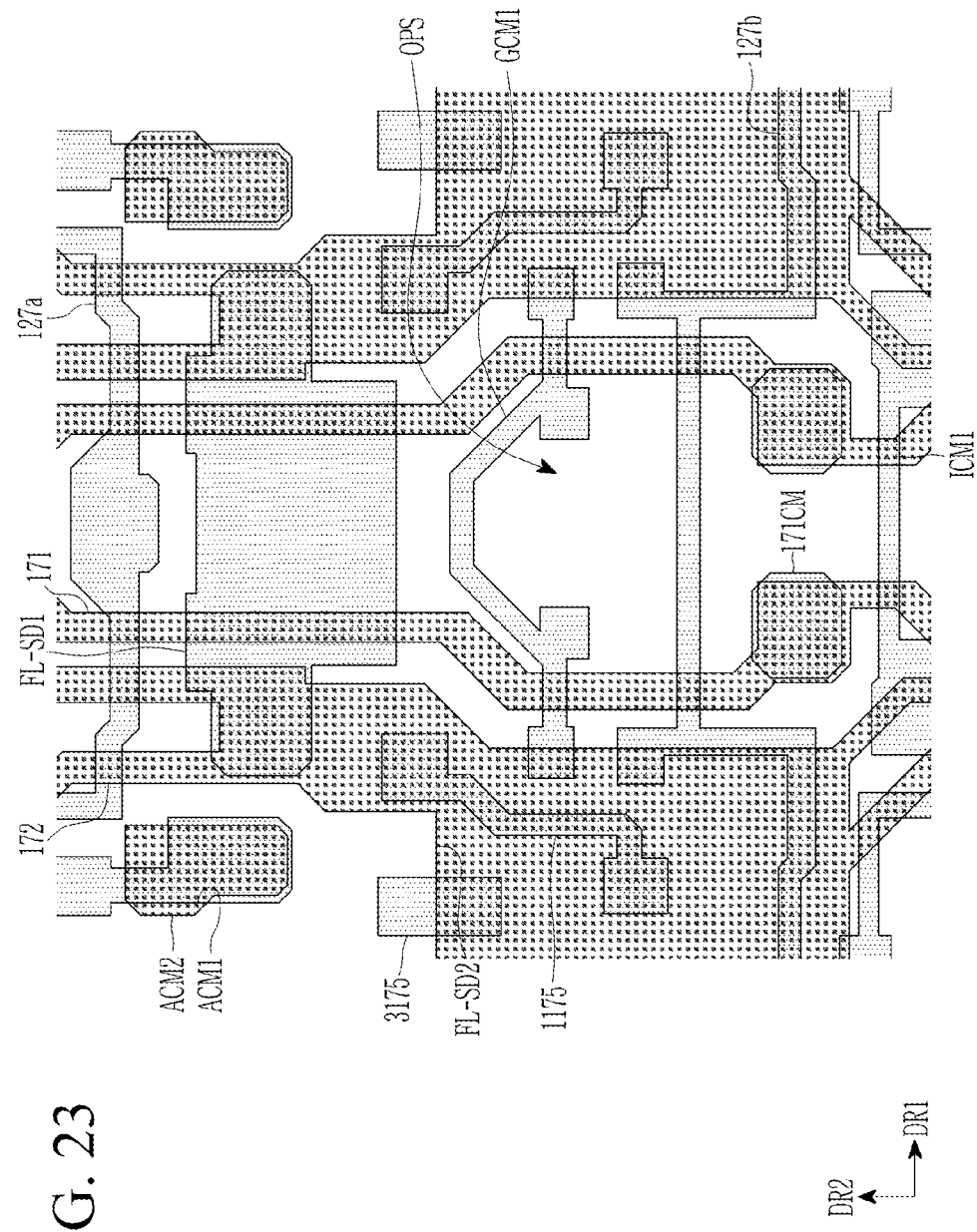

Hereinafter, a detailed planar structure of each pixel formed in the display area DA and the first component area EA1 will be described with reference to FIGS. 9 to 24. FIGS. 9 to 18 are diagrams specifically illustrating an embodiment of a structure of each layer according to a manufacturing order of a display panel layer in the display device, FIG. 19 is a plan view of a first data conductive layer and a second data conductive layer disposed in a display area, FIG. 20 is a plan view illustrating an opening of a barrier and an anode disposed on the second data conductive layer of FIG. 19, FIG. 21 is a plan view illustrating the first data conductive layer and the opening of the barrier on the second data conductive layer, FIGS. 22 and 23 are plan views of the first data conductive layer and the second data conductive layer disposed in the component area, respectively, and FIG. 24 is a diagram illustrating a cross section of the display panel layer according to FIG. 18.

Figure 9:
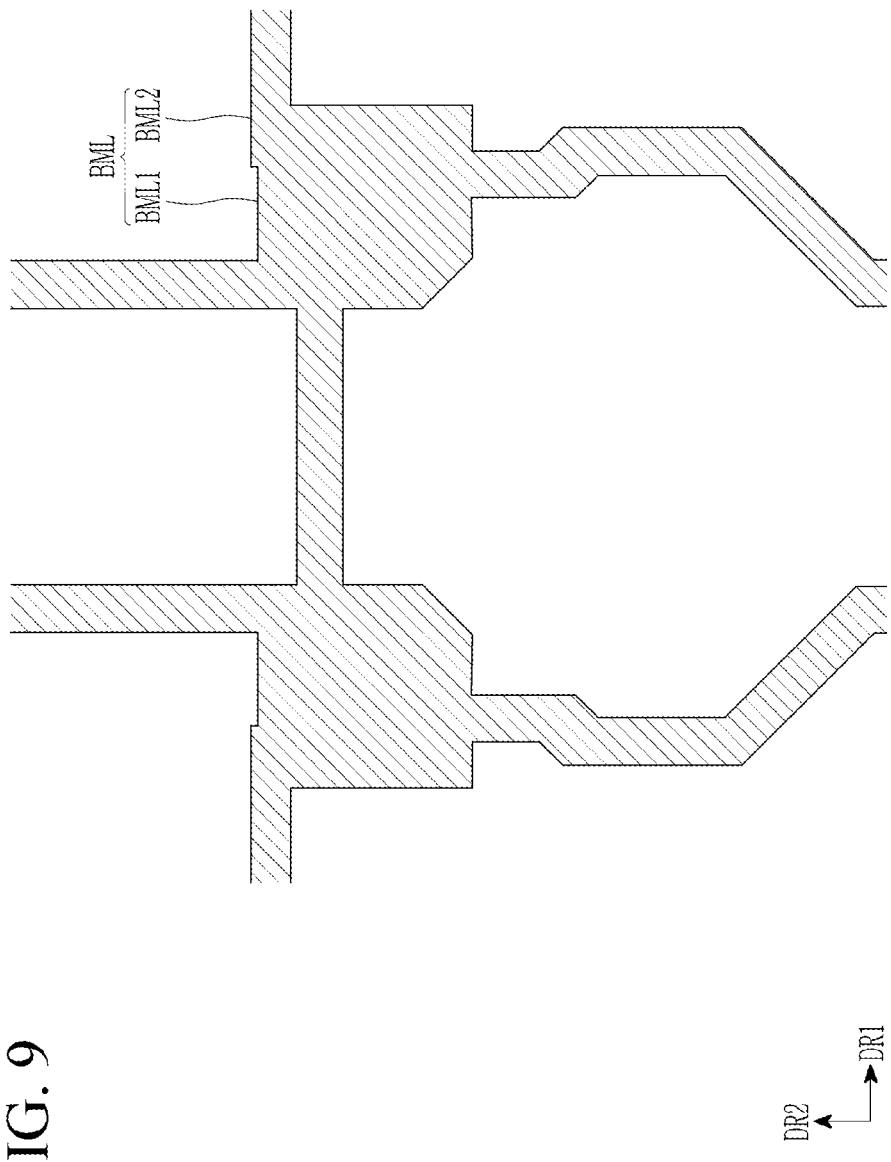
FIGS. 9 to 18 are diagrams specifically illustrating an embodiment of a structure of each layer according to a manufacturing order of a display panel layer in the display device.
Figure 24:
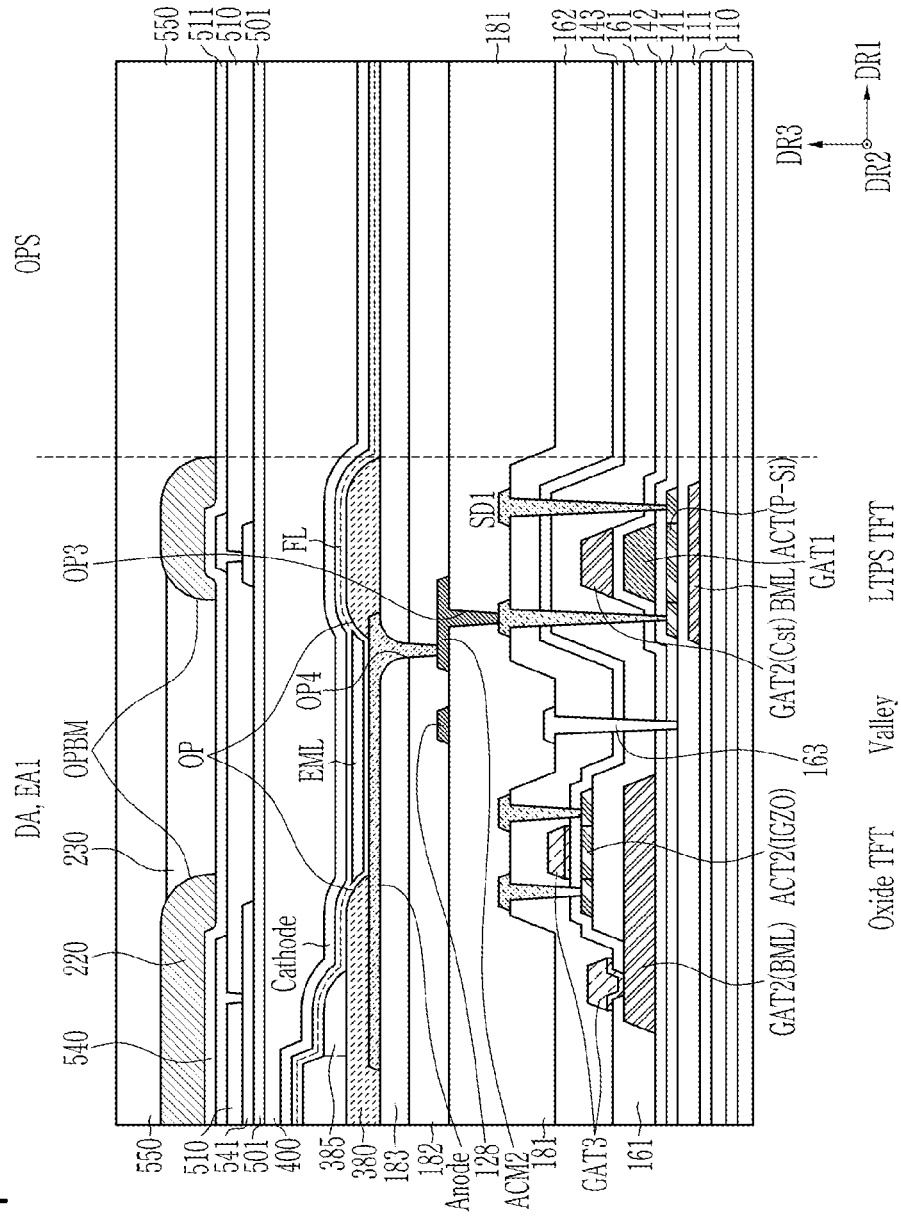
FIG. 24 is a diagram illustrating a cross section of the display panel layer according to FIG. 18.

First, referring to FIGS. 9 and 24, a metal layer BML is disposed on the substrate 110.

The substrate 110 may include a material that is not bent due to a rigid characteristic, such as glass, or a flexible material that may be bent, such as plastic or polyimide. In the case of a flexible substrate, as illustrated in FIG. 24, a double-layer structure of polyimide and a barrier layer including an inorganic insulating material thereon may be repeatedly formed.

The metal layer BML includes a plurality of extensions BML1 and connectors BML2 connecting the plurality of extensions BML1 to each other. The extension BML1 of the metal layer BML may be formed at a position overlapping with a channel 1132 of the driving transistor T1 in a plan view of a first semiconductor layer to be described below.

The metal layer BML is also referred to as a lower shielding layer and may include a metal or a metal alloy such as copper (Cu), molybdenum (Mo), aluminum (Al), or titanium (Ti), and additionally include amorphous silicon, and may be configured as a single layer or multi-layer.

Referring to FIG. 24, a buffer layer 111 covering the substrate 110 and the metal layer BML is disposed thereon.

The buffer layer 111 serves to block the penetration of impurity elements into a first semiconductor layer 130 (ACT in FIG. 24) and may be an inorganic insulating layer including silicon oxide (SiOx), silicon nitride (SiNx), silicon oxynitride (SiONx), or the like.

Figure 10:
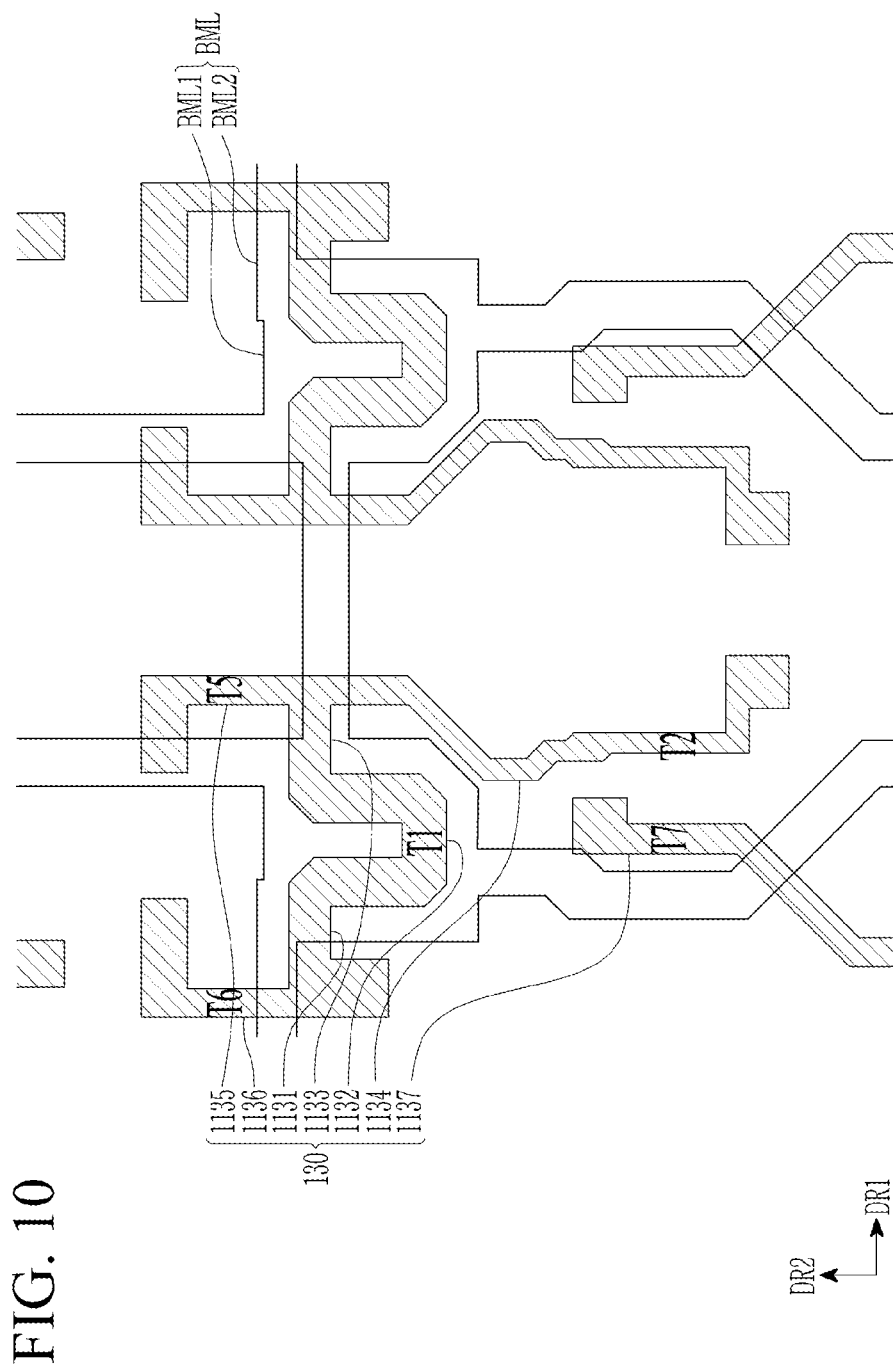

Next, referring to FIG. 10, the first semiconductor layer 130 including a silicon semiconductor (e.g., a polycrystalline semiconductor) is disposed on the buffer layer 111. The first semiconductor layer 130 includes a channel 1132, a first region 1131, and a second region 1133 of the driving transistor T1. In addition, the first semiconductor layer 130 includes channels of the second transistor T2, the fifth transistor T5, the sixth transistor T6, and the seventh transistor T7 as well as the driving transistor T1, and regions having a conductive layer characteristic by plasma treatment or doping are provided on opposite sides of each channel to serve as a first electrode and a second electrode.

The channel 1132 of the driving transistor T1 may have a curved shape in a plan view. However, the shape of the channel 1132 of the driving transistor T1 is not limited thereto and may be variously changed. In an embodiment, the channel 1132 of the driving transistor T1 may be bent in other shapes and may also have a bar shape, for example. The first region 1131 and the second region 1133 of the driving transistor T1 may be disposed on opposite sides of the channel 1132 of the driving transistor T1. The first region 1131 and the second region 1133 disposed in the first semiconductor layer serve as the first electrode and the second electrode of the driving transistor T1.

In the first semiconductor layer 130, a channel, a first region, and a second region of the second transistor T2 are disposed in a portion 1134 extending downward from the second region 1133 of the driving transistor T1. A channel, a first region, and a second region of the fifth transistor T5 are disposed in a portion 1135 extending upward from the second region 1133 of the driving transistor T1. A channel, a first region, and a second region of the sixth transistor T6 are disposed in a portion 1136 extending upward from the first region 1131 of the driving transistor T1. The first semiconductor layer 130 includes a portion 1137 disposed adjacent to the channel, the first region, and the second region of the second transistor T2, which includes a channel, a first region, and a second region of the seventh transistor T7. In two adjacent first semiconductor layers 130, a distance between the fifth transistors T5 may be smaller than a distance between the second transistors T2. A predetermined space may be defined between the adjacent second transistors T2. The predetermined space may form a transmission unit (OPS of FIG. 20) in a first component area.

Referring to FIG. 24, a first gate insulating layer 141 may be disposed on the first semiconductor layer 130 including the channel 1132, the first region 1131, and the second region 1133 of the driving transistor T1. The first gate insulating layer 141 may be an inorganic insulating layer including silicon oxide (SiOx), silicon nitride (SiNx), silicon oxynitride (SiONx), or the like.

Figure 11:
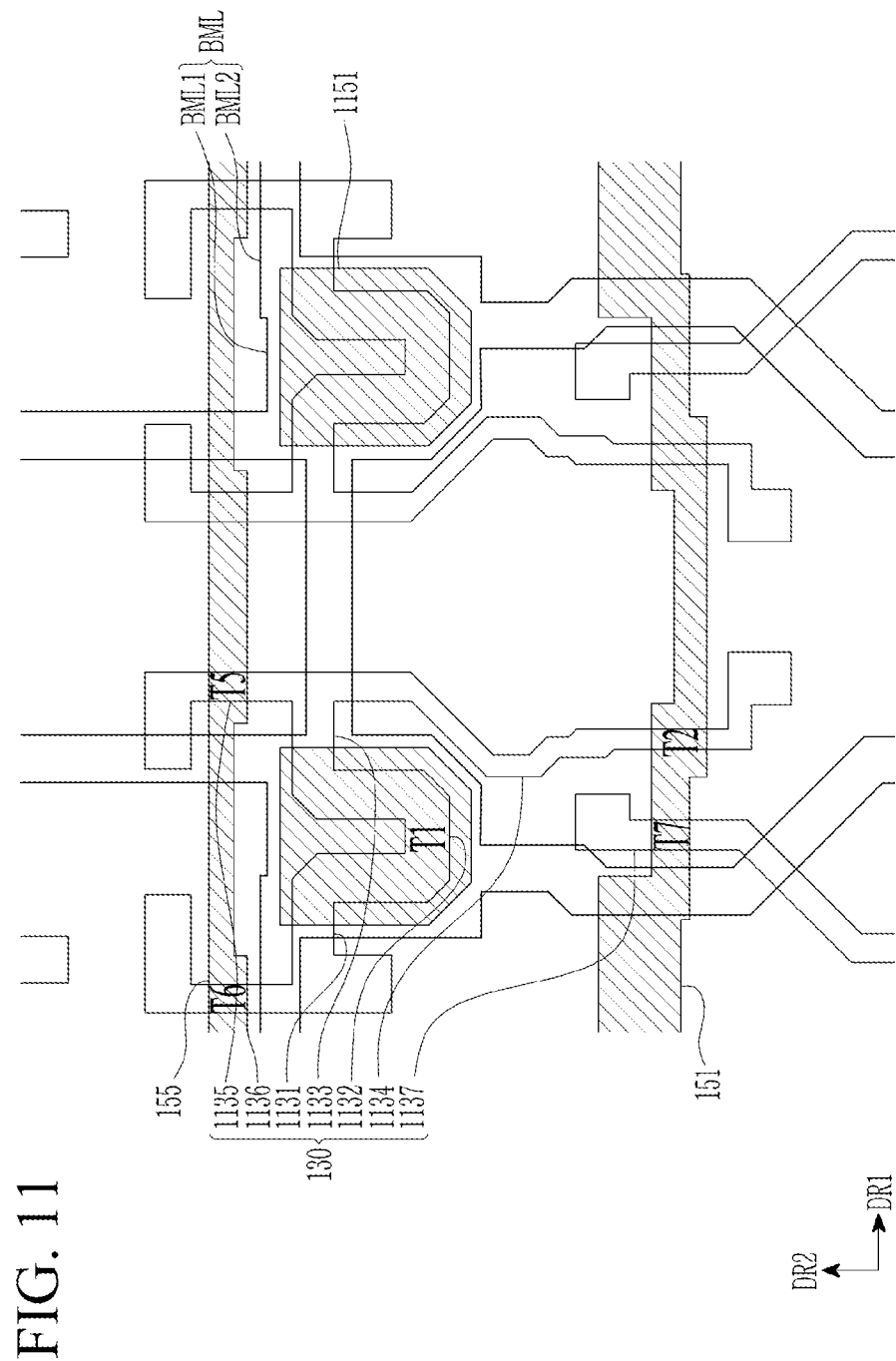

Referring to FIG. 11, a first gate conductive layer including a gate electrode 1151 of the driving transistor T1 may be disposed on the first gate insulating layer 141. The first gate conductive layer includes gate electrodes of the second transistor T2, the fifth transistor T5, the sixth transistor T6, and the seventh transistor T7 as well as the driving transistor T1, respectively. The gate electrode 1151 of the driving transistor T1 may overlap with the channel 1132 of the driving transistor T1. The channel 1132 of the driving transistor T1 is covered by the gate electrode 1151 of the driving transistor T1.

The first gate conductive layer may further include a first scan line 151 and a light-emitting control line 155. The first scan line 151 and the light-emitting control line 155 may extend in a substantially horizontal direction (hereinafter also referred to as a first direction DR1). The first scan line 151 may be connected to a gate electrode of the second transistor T2. The first scan line 151 may be formed integrally with the gate electrode of the second transistor T2. The first scan line 151 may also be connected to a gate electrode of the seventh transistor T7 of a rear-stage pixel. The first scan line 151 may be formed integrally with the gate electrode of the seventh transistor T7.

The light-emitting control line 155 may be connected to the gate electrode of the fifth transistor T5 and the gate electrode of the sixth transistor T6, and the light-emitting control line 155 and the gate electrodes of the fifth transistor T5 and the sixth transistor T6 may be unitary.

The first gate conductive layer may include a metal or a metal alloy such as copper (Cu), molybdenum (Mo), aluminum (Al), or titanium (Ti) and may be configured as a single layer or multi-layer.

After the first gate conductive layer including the gate electrode 1151 of the driving transistor T1 is formed, an exposed region of the first semiconductor layer may be conductive by performing plasma treatment or a doping process. That is, the first semiconductor layer covered by the first gate conductive layer may not be conductive, and the portion of the first semiconductor layer which is not covered by the first gate conductive layer may have the same characteristics as the conductive layer. As a result, the transistor including the conductive portion has a p-type transistor characteristic, and the driving transistor T1, the second transistor T2, the fifth transistor T5, the sixth transistor T6, and the seventh transistor T7 may be p-type transistors.

Referring to FIG. 24, a second gate insulating layer 142 may be disposed on a first gate conductive layer GAT1 including the gate electrode 1151 of the driving transistor T1 and the first gate insulating layer 141. The second gate insulating layer 142 may be an inorganic insulating layer including silicon oxide (SiOx), silicon nitride (SiNx), silicon oxynitride (SiONx), or the like.

Figure 12:
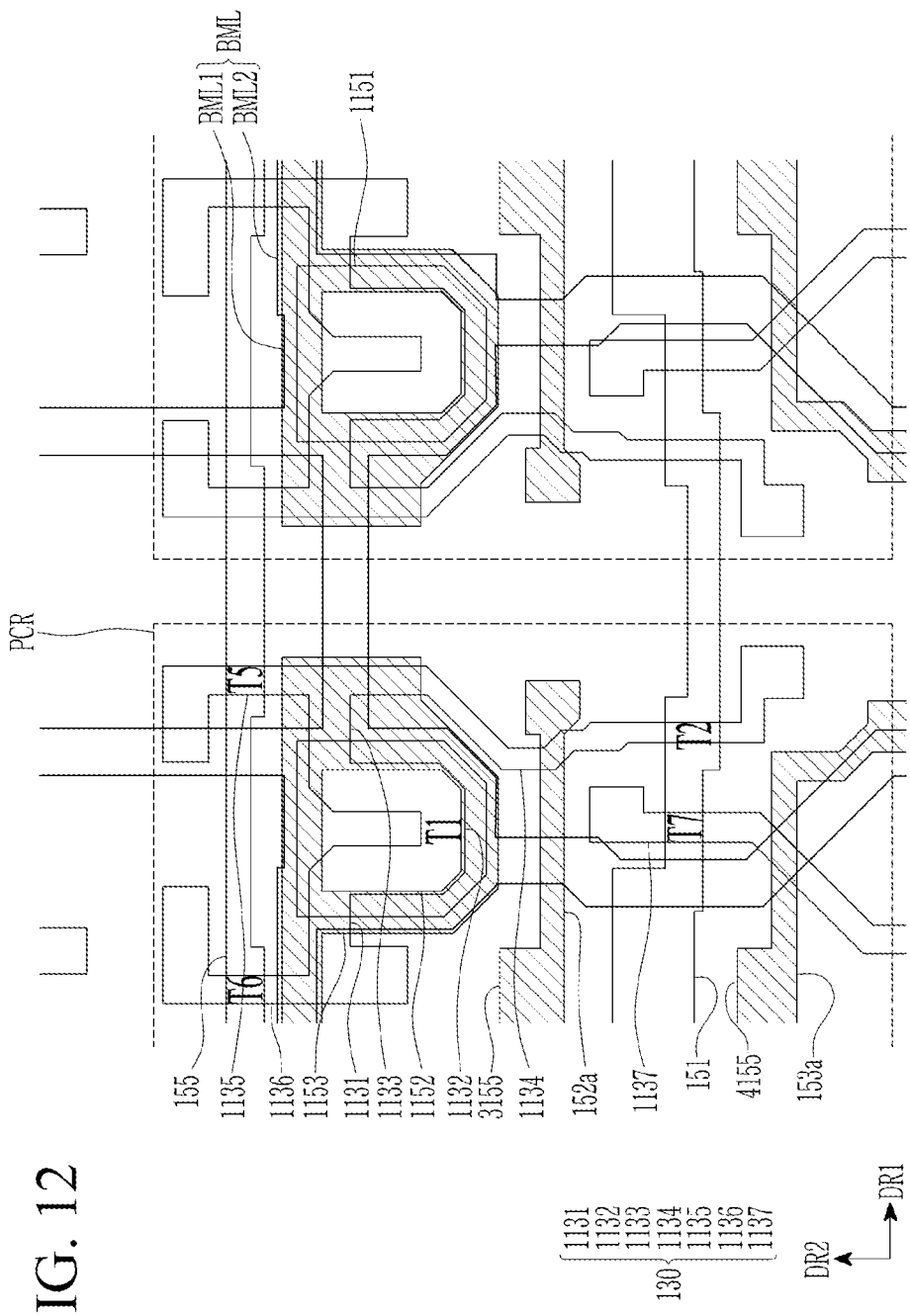

Referring to FIG. 12, on the second gate insulating layer 142, a second gate conductive layer including a first storage electrode 1153 of the storage capacitor Cst, a lower shielding layer 3155 of the third transistor T3, and a lower shielding layer 4155 of the fourth transistor T4 may be disposed. The lower shielding layers 3155 and 4155 are disposed below the channels of the third transistor T3 and the fourth transistor T4, respectively, and serve to shield light, electromagnetic interference, or the like provided to the channels from the lower side.

The first storage electrode 1153 overlaps with the gate electrode 1151 of the driving transistor T1 to form the storage capacitor Cst. An opening 1152 is defined in the first storage electrode 1153 of the storage capacitor Cst. The opening 1152 of the first storage electrode 1153 of the storage capacitor Cst may overlap with the gate electrode 1151 of the driving transistor T1.

The lower shielding layer 3155 of the third transistor T3 may overlap with a channel 3137 and a gate electrode 3151 of the third transistor T3. The lower shielding layer 4155 of the fourth transistor T4 may overlap with a channel 4137 and a gate electrode 4151 of the fourth transistor T4.

The second gate conductive layer may further include a lower second scan line 152a and a lower initialization control line 153a. The lower second scan line 152a and the lower initialization control line 153a may extend in a substantially horizontal direction (a first direction). The lower second scan line 152a may be connected to the lower shielding layer 3155 of the third transistor T3. The lower second scan line 152a may be formed integrally with the lower shielding layer 3155 of the third transistor T3. The lower initialization control line 153a may be connected to the lower shielding layer 4155 of the fourth transistor T4. The lower initialization control line 153a may be formed integrally with the lower shielding layer 4155 of the fourth transistor T4.

The second gate conductive layers disposed in adjacent pixel circuit regions PCR may be spaced apart from each other. That is, with reference to FIG. 12, the second gate conductive layer disposed in a left pixel circuit region PCR and the second gate conductive layer disposed in a right pixel circuit region PCR may be spaced apart from each other and may have a disconnected shape.

A second gate conductive layer GAT2 may include a metal or a metal alloy such as copper (Cu), molybdenum (Mo), aluminum (Al), or titanium (Ti), and may be configured as a single layer or multi-layer.

Referring to FIG. 24, a first inter-insulating layer 161 may be disposed on the second gate conductive layer GAT2 including the first storage electrode 1153 of the storage capacitor Cst, the lower shielding layer 3155 of the third transistor T3, and the lower shielding layer 4155 of the fourth transistor T4. The first inter-insulating layer 161 may include an inorganic insulating layer including silicon oxide (SiOx), silicon nitride (SiNx), silicon oxynitride (SiONx), or the like, and in some embodiments, an inorganic insulating material may be thickly formed.

Figure 13:
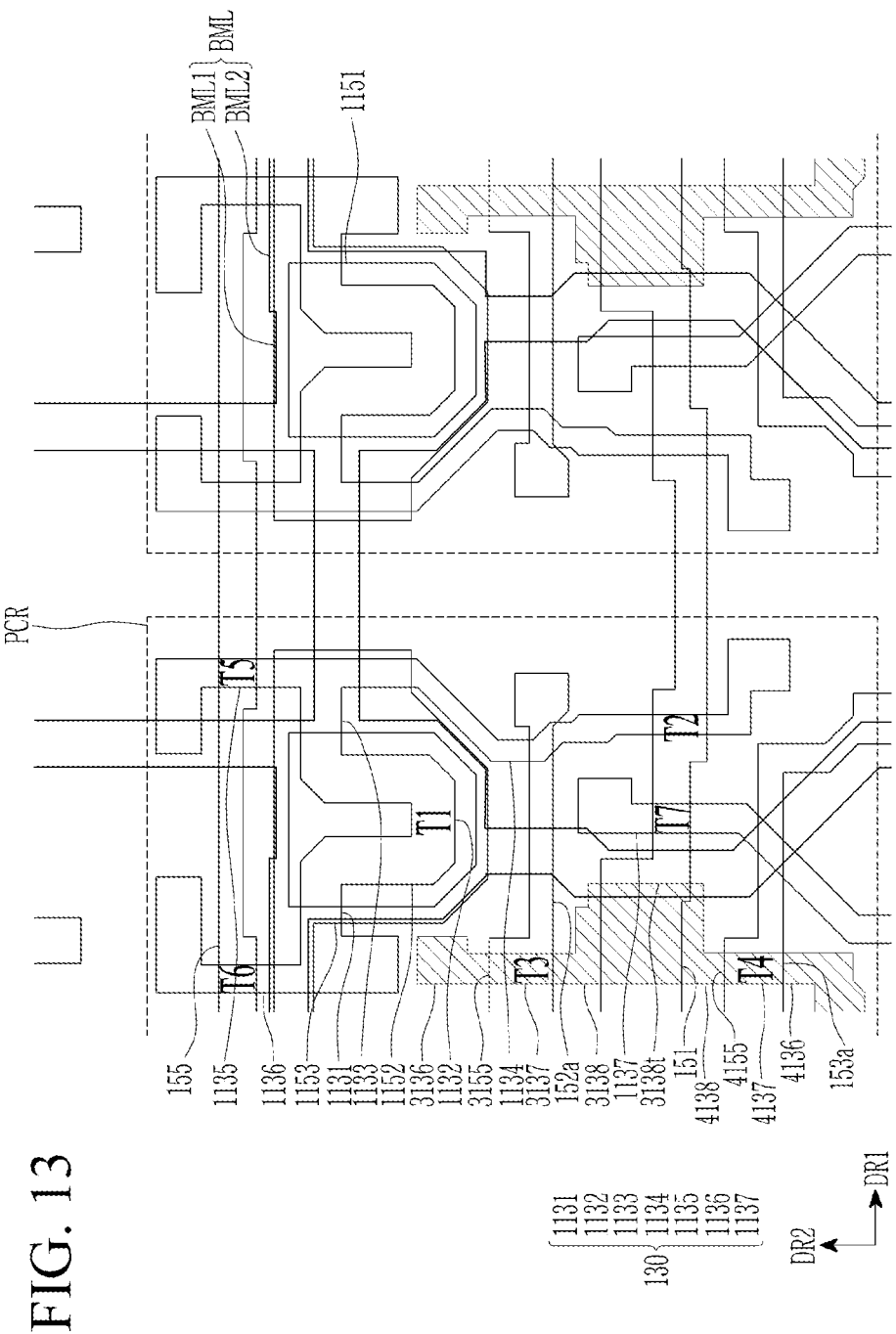

Referring to FIG. 13, on the first inter-insulating layer 161, a second semiconductor layer including the channel 3137, a first region 3136 and a second region 3138 of the third transistor T3, and the channel 4137, a first region 4136 and a second region 4138 of the fourth transistor T4 are disposed. The second semiconductor layer may include an oxide semiconductor. The second semiconductor layer may include an upper boost electrode 3138t of the boost capacitor $C_{boost}$.

The channel 3137, the first region 3136 and the second region 3138 of the third transistor T3, and the channel 4137, the first region 4136, and the second region 4138 of the fourth transistor T4 may be connected to each other to be formed integrally. The first region 3136 and the second region 3138 of the third transistor T3 are disposed on opposite sides of the channel 3137 of the third transistor T3, and the first region 4136 and the second region 4138 of the fourth transistor T4 are disposed on opposite sides of the channel 4137 of the fourth transistor T4. The second region 3138 of the third transistor T3 is connected to the second region 4138 of the fourth transistor T4. The channel 3137 of the third transistor T3 overlaps with the lower shielding layer 3155, and the channel 4137 of the fourth transistor T4 overlaps with the lower shielding layer 4155.

The upper boost electrode 3138t of the boost capacitor $C_{boost}$ is disposed between the second region 3138 of the third transistor T3 and the second region 4138 of the fourth transistor T4. The upper boost electrode 3138t of the boost capacitor $C_{boost}$ overlaps with a lower boost electrode of the boost capacitor $C_{boost}$ to configure the boost capacitor $C_{boost}$.

The second semiconductor layers disposed in the adjacent pixel circuit regions PCR may be spaced apart from each other. That is, with reference to FIG. 13, the second semiconductor layer disposed in a left pixel circuit region PCR and the second semiconductor layer disposed in a right pixel circuit region PCR may be spaced apart from each other and may have a disconnected shape.

Referring to FIG. 24, a third gate insulating layer 143 may be disposed on the second semiconductor layer ACT2 including the channel 3137, the first region 3136 and the second region 3138 of the third transistor T3, the channel 4137, the first region 4136 and the second region 4138 of the fourth transistor T4, and the upper boost electrode 3138t of the boost capacitor $C_{boost}$.

The third gate insulating layer 143 may be disposed on the entire surface of the second semiconductor layer ACT2 and the first inter-insulating layer 161. Accordingly, the third gate insulating layer 143 may cover the channel 3137, the first region 3136 and the second region 3138 of the third transistor T3, the channel 4137, the first region 4136 and the second region 4138 of the fourth transistor T4, and an upper surface and a side surface of the upper boost electrode 3138t of the boost capacitor $C_{boost}$. However, the disclosure is not limited thereto, and the third gate insulating layer 143 may not be disposed on the entire surface of the second semiconductor layer ACT2 and the first inter-insulating layer 161. In an embodiment, the third gate insulating layer 143 may overlap with the channel 3137 of the third transistor T3 and may also not overlap with the first region 3136 and the second region 3138, for example. In addition, the third gate insulating layer 143 may overlap with the channel 4137 of the fourth transistor T4 and may also not overlap with the first region 4136 and the second region 4138. The third gate insulating layer 143 may include an inorganic insulating layer including silicon oxide (SiOx), silicon nitride (SiNx), silicon oxynitride (SiONx), or the like.

Figure 14:
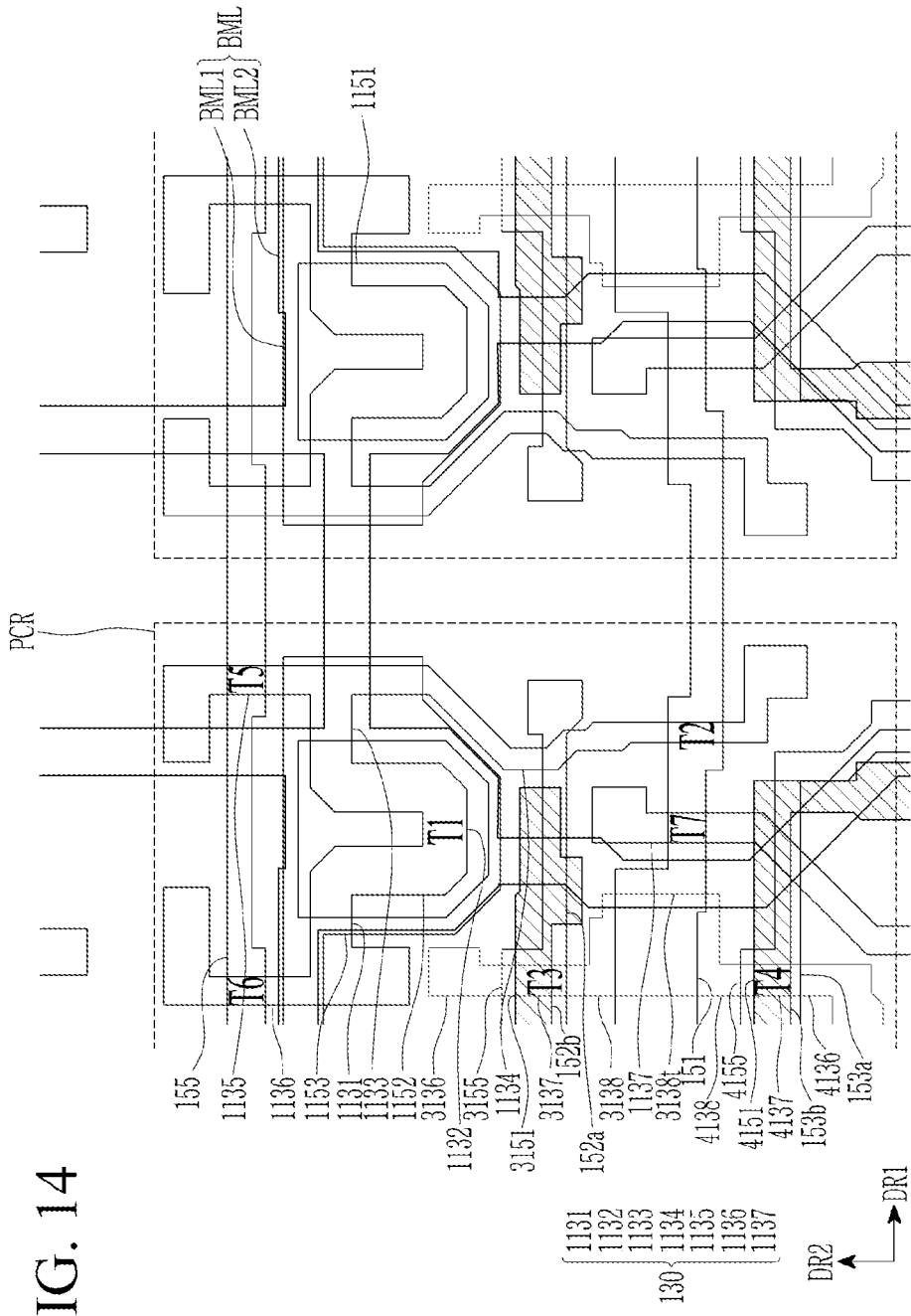

Referring to FIG. 14, a third gate conductive layer including the gate electrode 3151 of the third transistor T3 and the gate electrode 4151 of the fourth transistor T4 is disposed on the third gate insulating layer 143

The gate electrode 3151 of the third transistor T3 may overlap with the channel 3137 of the third transistor T3. The gate electrode 3151 of the third transistor T3 may overlap with the lower shielding layer 3155 of the third transistor T3.

The gate electrode 4151 of the fourth transistor T4 may overlap with the channel 4137 of the fourth transistor T4. The gate electrode 4151 of the fourth transistor T4 may overlap with the lower shielding layer 4155 of the fourth transistor T4.

The third gate conductive layer may further include an upper second scan line 152b and an upper initialization control line 153b.

The upper second scan line 152b and the upper initialization control line 153b may extend in the substantially horizontal direction (the first direction DR1). The upper second scan line 152b may form a second scan line 152 together with the lower second scan line 152a. The upper second scan line 152b may be connected to the gate electrode 3151 of the third transistor T3. The upper second scan line 152b may be formed integrally with the gate electrode 3151 of the third transistor T3. The upper initialization control line 153b may form an initialization control line 153 together with the lower initialization control line 153a. The upper initialization control line 153b may be connected to the gate electrode 4151 of the fourth transistor T4. The upper initialization control line 153b may be formed integrally with the gate electrode 4151 of the fourth transistor T4.

The third gate conductive layers disposed in the adjacent pixel circuit regions PCR may be spaced apart from each other. That is, with reference to FIG. 14, the third gate conductive layer disposed in a left pixel circuit region PCR and the third gate conductive layer disposed in a right pixel circuit region PCR may be spaced apart from each other and may have a disconnected shape.

A third gate conductive layer GAT3 may include a metal or a metal alloy such as copper (Cu), molybdenum (Mo), aluminum (Al), or titanium (Ti), and may be configured as a single layer or multi-layer.

After forming the third gate conductive layer including the gate electrode 3151 of the third transistor T3 and the gate electrode 4151 of the fourth transistor T4, a portion of the oxide semiconductor layer covered by the third gate conductive layer is formed as a channel by plasma treatment or a doping process, and a portion of the oxide semiconductor layer not covered by the third gate conductive layer is conductive. The channel 3137 of the third transistor T3 may be disposed below the gate electrode 3151 to overlap with the gate electrode 3151. The first region 3136 and the second region 3138 of the third transistor T3 may not overlap with the gate electrode 3151. The channel 4137 of the fourth transistor T4 may be disposed below the gate electrode 4151 to overlap with the gate electrode 4151. The first region 4136 and the second region 4138 of the fourth transistor T4 may not overlap with the gate electrode 4151. The upper boost electrode 3138*t* may not overlap with the third gate conductive layer. A transistor including the oxide semiconductor layer may have characteristics of an n-type transistor.

Referring to FIG. 24, a second inter-insulating layer 162 may be disposed on the third gate conductive layer GAT3 including the gate electrode 3151 of the third transistor T3 and the gate electrode 4151 of the fourth transistor T4. The second inter-insulating layer 162 may have a single-layered or multi-layered structure. The second inter-insulating layer 162 may include an inorganic insulating material such as silicon nitride (SiNx), silicon oxide (SiOx), or silicon oxynitride (SiOxNy), and may include an organic material in some embodiments.

Figure 15:
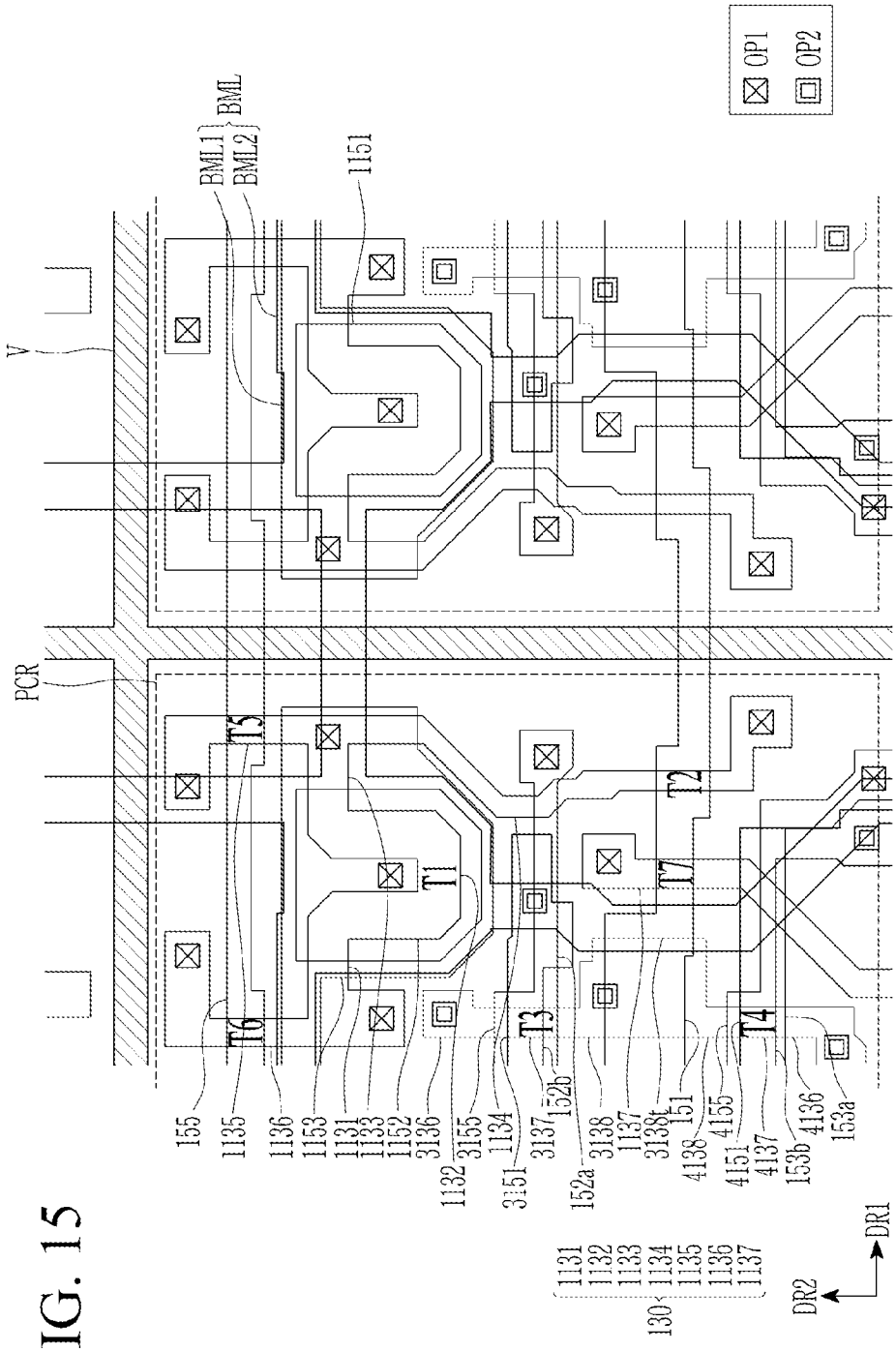

Next, referring to FIGS. 15 and 24, a valley V may penetrate through the second inter-insulating layer 162, the third gate insulating layer 143, the first inter-insulating layer 161, the second gate insulating layer 142, and the first gate insulating layer 141. The valley V may separate the adjacent pixel circuit regions PCR. In the specification, it has been illustrated an embodiment in which the valley V penetrates up to the first gate insulating layer 141 but is not limited thereto and an embodiment in which the valley V penetrates up to a barrier layer of the buffer layer 111 or the substrate 110 may be possible.

The valley V according to the specification may separate the adjacent pixel circuit regions PCR, and the adjacent pixel circuit regions PCR may be divided into two parallel straight lines in a second direction DR2. However, the invention is not limited thereto, and the shape of the valley V separating the pixel circuit regions PCR may be variously modified.

In an embodiment, the valley V overlapping with the transmission unit (refer to the OPS of FIG. 20) of the first component area EA1 may be removed, for example. The valley V of FIG. 15 has a shape that crosses the transmission unit (refer to the OPS of FIG. 20), but in an embodiment, the valley of FIG. 15 may have a disconnected shape along the second direction DR2 with respect to the transmission unit (refer to the OPS of FIG. 20).

In an alternative embodiment, the valley V may include a plurality of regions having different widths. In an embodiment, the width of the valley V overlapping with the transmission unit (refer to the OPS of FIG. 20) of the first component area EA1 may be greater than the width of the remaining valley V disposed between the pixel circuit regions PCR, for example. The width of the valley V overlapping with the transmission unit (refer to the OPS of FIG. 20) of the first component area EA1 may be substantially the same as the width of the transmission unit (refer to the OPS of FIG. 20). In this case, most of the transmission unit may overlap with the valley V, and the valley V may provide a uniform refractive index with respect to a region overlapping with the transmission unit.

Figure 16:
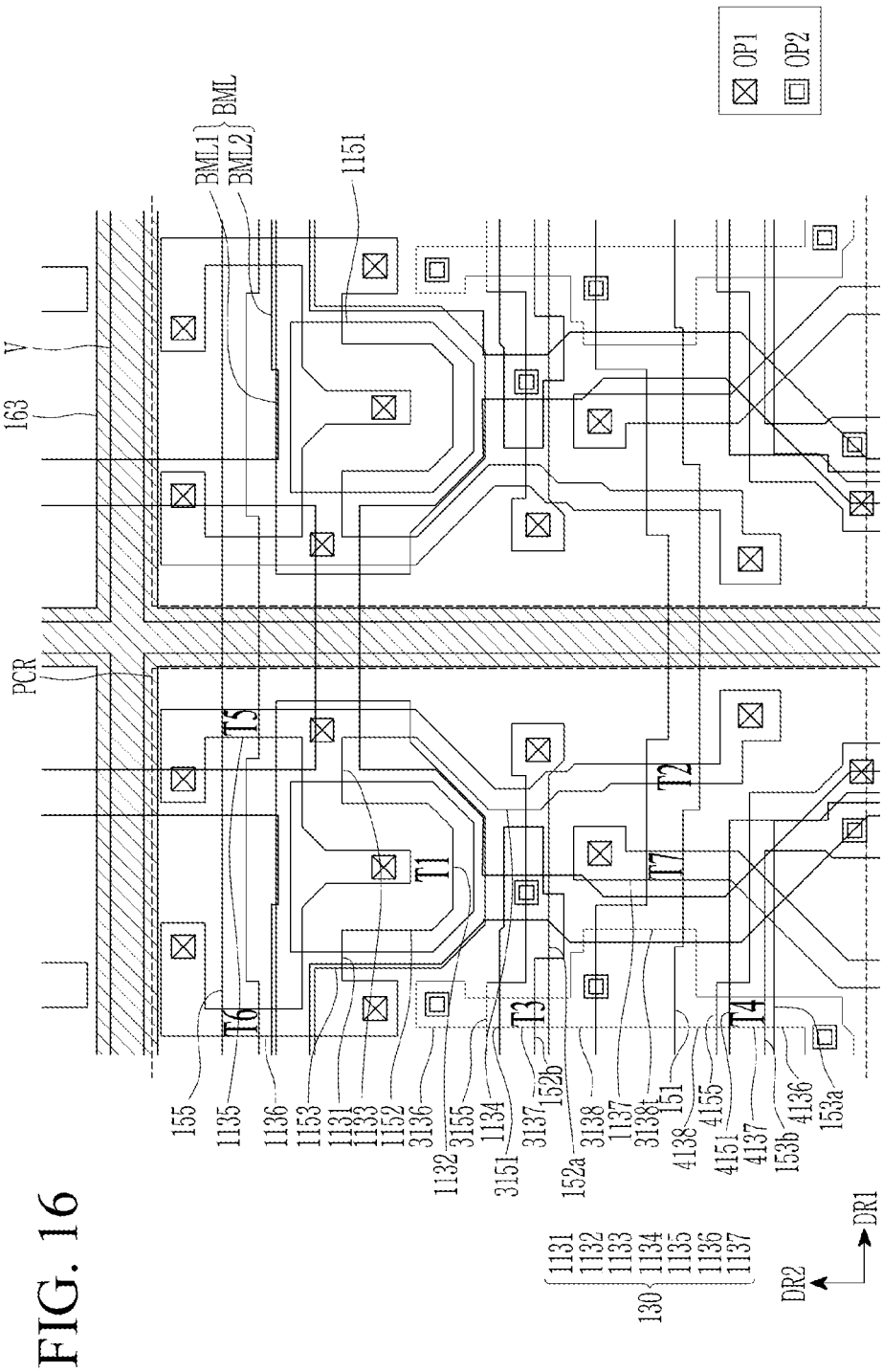

Thereafter, referring to FIG. 16, the third insulating layer 163 may fill the valley V. The plurality of pixel circuit regions PCR may be divided by the third insulating layer 163. The first and second semiconductor layers and the second and third gate conductive layers disposed in different pixel circuit regions PCR are not directly connected to each other but are spaced apart from each other by the third insulating layer 163.

The third insulating layer 163 may be disposed between the plurality of pixel circuit regions PCR and may surround edges of the pixel circuit regions PCR. The valley V is defined in the second inter-insulating layer 162, the first inter-insulating layer 161, the third gate insulating layer 143, the second gate insulating layer 142, and the first gate insulating layer 141 including inorganic materials and the third insulating layer 163 including an organic material is disposed in the valley V, so as to form each pixel circuit region in an island type. Accordingly, even when damage occurs to the second inter-insulating layer 162, the first inter-insulating layer 161, the third gate insulating layer 143, the second gate insulating layer 142, and the first gate insulating layer 141 by applying an impact from the outside, the plurality of pixel circuit regions PCR has an independent structure by the third insulating layer 163 including an organic material, thereby preventing an influence on other adjacent pixels. That is, it is possible to prevent cracks generated in any one region from propagating in a horizontal direction.

The third insulating layer 163 may include an organic material, a non-conductive inorganic material, a metal, or the like.

Referring to FIG. 15, two types of openings OP1 and OP2 may be defined in the second inter-insulating layer 162. The two types of openings OP1 and OP2 may be defined using different masks.

The opening OP1 may expose the first semiconductor layer 130, the first gate conductive layer, or the second gate conductive layer by defining an opening in at least one of the second inter-insulating layer 162, the third gate insulating layer 143, the first inter-insulating layer 161, the second gate insulating layer 142, and the first gate insulating layer 141.

The opening OP2 may expose the oxide semiconductor layer or the third gate conductive layer by defining an opening in the second inter-insulating layer 162 and/or the third gate insulating layer 143.

One of the openings OP1 overlaps with at least a portion of the gate electrode 1151 of the driving transistor T1 and may also be defined even in the third gate insulating layer 143, the first inter-insulating layer 161, and the second gate insulating layer 142. In this case, one of the openings OP1 may overlap with the opening 1152 of the first storage electrode 1153 and may be disposed inside the opening 1152 of the first storage electrode 1153.

One of the openings OP2 may at least partially overlap with the boost capacitor $C_{boost}$ and may be defined in the third gate insulating layer 143.

The other one of the openings OP2 may overlap with at least a portion of the first region 3136 of the third transistor T3 and be defined in the third gate insulating layer 143.

In an embodiment, the valley V may be defined in the same process of forming the first opening OP1. The second opening OP2 may be defined through another process after defining the valley V or may be defined through another process after forming the third insulating layer 163.

Figure 17:
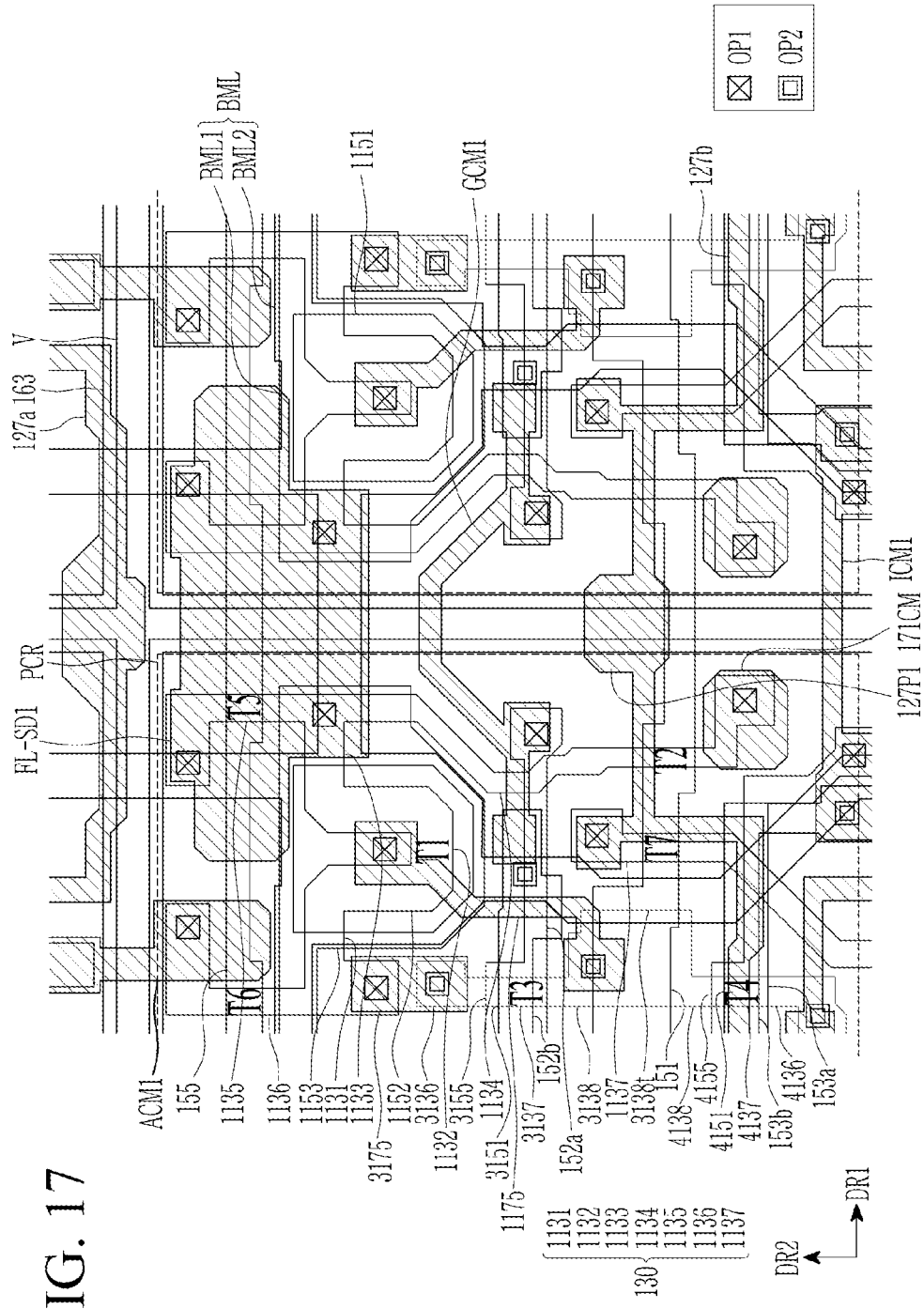

Then, referring to FIGS. 17 and 19, a first data conductive layer including a first connection electrode 1175 and a second connection electrode 3175 may be disposed on the second inter-insulating layer 162. Since it may be difficult to easily recognize the first data conductive layer in FIG. 17, only the first data conductive layer disposed in the display area and a second data conductive layer to be described below are illustrated in FIG. 19.

The first connection electrode 1175 may overlap with the gate electrode 1151 of the driving transistor T1. The first connection electrode 1175 may be connected to the gate electrode 1151 of the driving transistor T1 through the opening OP1 and the opening 1152 of the first storage electrode 1153. The first connection electrode 1175 may overlap with the boost capacitor $C_{boost}$. The first connection electrode 1175 may be connected to the upper boost electrode 3138t of the boost capacitor $C_{boost}$ through the opening OP2. Accordingly, the gate electrode 1151 of the driving transistor T1 and the upper boost electrode 3138t of the boost capacitor $C_{boost}$ may be connected to each other by the first connection electrode 1175. In this case, the gate electrode 1151 of the driving transistor T1 may be connected to the second region 3138 of the third transistor T3 and the second region 4138 of the fourth transistor T4 by the first connection electrode 1175.

The second connection electrode 3175 may overlap with the second region 1133 of the driving transistor T1. The second connection electrode 3175 may be connected to the second region 1133 of the driving transistor T1 through the opening OP1. The second connection electrode 3175 may overlap with the first region 3136 of the third transistor T3. The second connection electrode 3175 may be connected to the first region 3136 of the third transistor T3 through the opening OP2. Accordingly, the second region 1133 of the driving transistor T1 and the first region 3136 of the third transistor T3 may be connected to each other by the second connection electrode 3175.

The first data conductive layer may include a first lower initialization voltage line 127a and a second lower initialization voltage line 127b extending substantially in the first direction DR1. Although the upper end of the first lower initialization voltage line 127a is illustrated as being cut, the first lower initialization voltage line 127a may have a shape extending along the first direction DR1 like the second lower initialization voltage line 127b. The first lower initialization voltage line 127a may receive a first initialization voltage, and the second lower initialization voltage line 127b may receive a second initialization voltage. The second lower initialization voltage line 127b may define a valley V and include a connection pad portion 127P1 overlapping with the third insulating layer 163. The second lower initialization voltage line 127b may be connected to a second upper initialization voltage line 128 to be described below through the connection pad portion 127P1.

The first data conductive layer may further include a connector 171CM, an anode connection member ACM1, and a storage electrode connector FL-SD1. The connector 171CM, the anode connection member ACM1, and the storage electrode connector FL-SD1X 1 may be disposed over the plurality of pixel circuit regions PCR across the valley V and the third insulating layer 163.

The connector 171CM is electrically connected to a portion 1137 of the first semiconductor layer 130, that is, the second transistor T2 through the opening OP1. The anode connection member ACM1 is electrically connected to a portion 1136 of the first semiconductor layer 130, that is, the sixth transistor T6 through the opening OP1. In addition, the anode connection member ACM1 may connect the sixth transistor T6 and the seventh transistor T7 of the adjacent pixel circuit regions PCR in the second direction DR2. The storage electrode connector FL-SD1 is substantially wide in order to planarize the anode disposed thereon. In addition, the storage electrode connector FL-SD1 is connected to a portion 1135 of the first semiconductor layer 130, that is, the fifth transistor T5 through the opening OP1, and is also electrically connected to the first storage electrode 1153 through the opening OP1. The storage electrode connector FL-SD1 may connect the first storage electrodes 1153 of the adjacent pixel circuit regions PCR along the first direction DR1.

In addition, the second scan line connector GCM1 may electrically connect the upper second scan line 152b and the lower second scan line 152a. In addition, the second scan line connector GCM1 may connect the upper second scan lines 152b spaced apart from each other and connect the lower second scan lines 152a spaced apart from each other in the adjacent pixel circuit regions PCR along the first direction DR1. The upper second scan line 152b, the lower second scan line 152a, and the second scan line connector GCM1 may form one second scan line, and the second scan line may have a shape extending substantially in the first direction DR1.

The initialization connector ICM1 may electrically connect the lower initialization control line 153a and the upper initialization control line 153b. The initialization connector ICM1 may connect the lower initialization control line 153a and the upper initialization control line 153b spaced apart from each other in the adjacent pixel circuit regions PCR in the first direction DR1 to each other. Accordingly, the lower initialization control line 153a, the upper initialization control line 153b and the initialization connector ICM1 may be electrically connected to each other to form the initialization control line 153. The initialization control line 153 may substantially extend in the first direction DR1.

A first data conductive layer SD1 may include a metal or a metal alloy such as aluminum (Al), copper (Cu), molybdenum (Mo), and titanium (Ti), and may be configured as a single layer or multi-layer.

Referring to FIG. 24, a first organic layer 181 may be disposed on the first data conductive layer SD1 including the first connection electrode 1175 and the second connection electrode 3175. The first organic layer 181 may be an organic insulating layer including an organic material, and the organic material may include at least one material selected from the group including polyimide, polyamide, an acrylic resin, benzocyclobutene, and a phenol resin.

Figure 18:
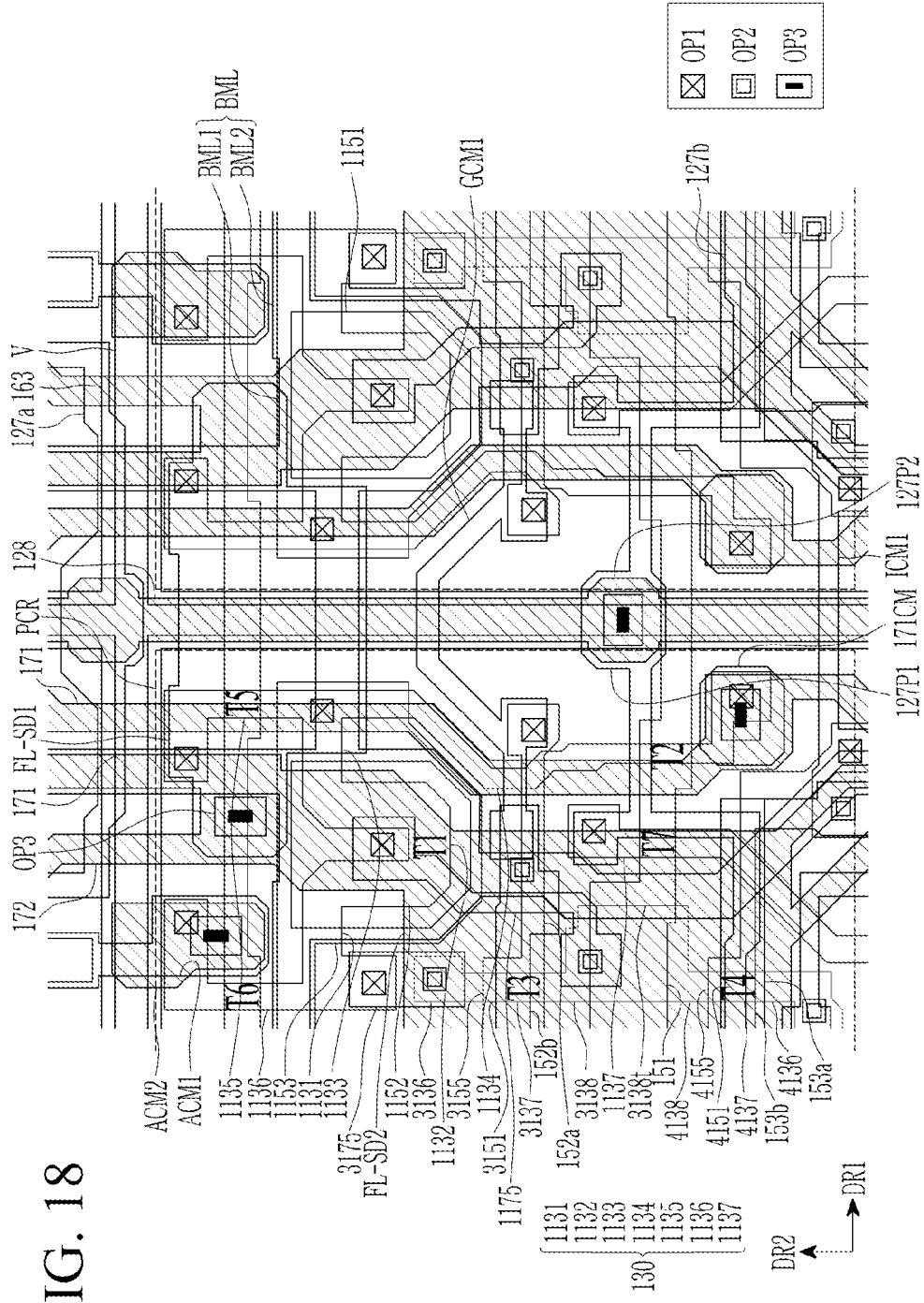
Figure 19:
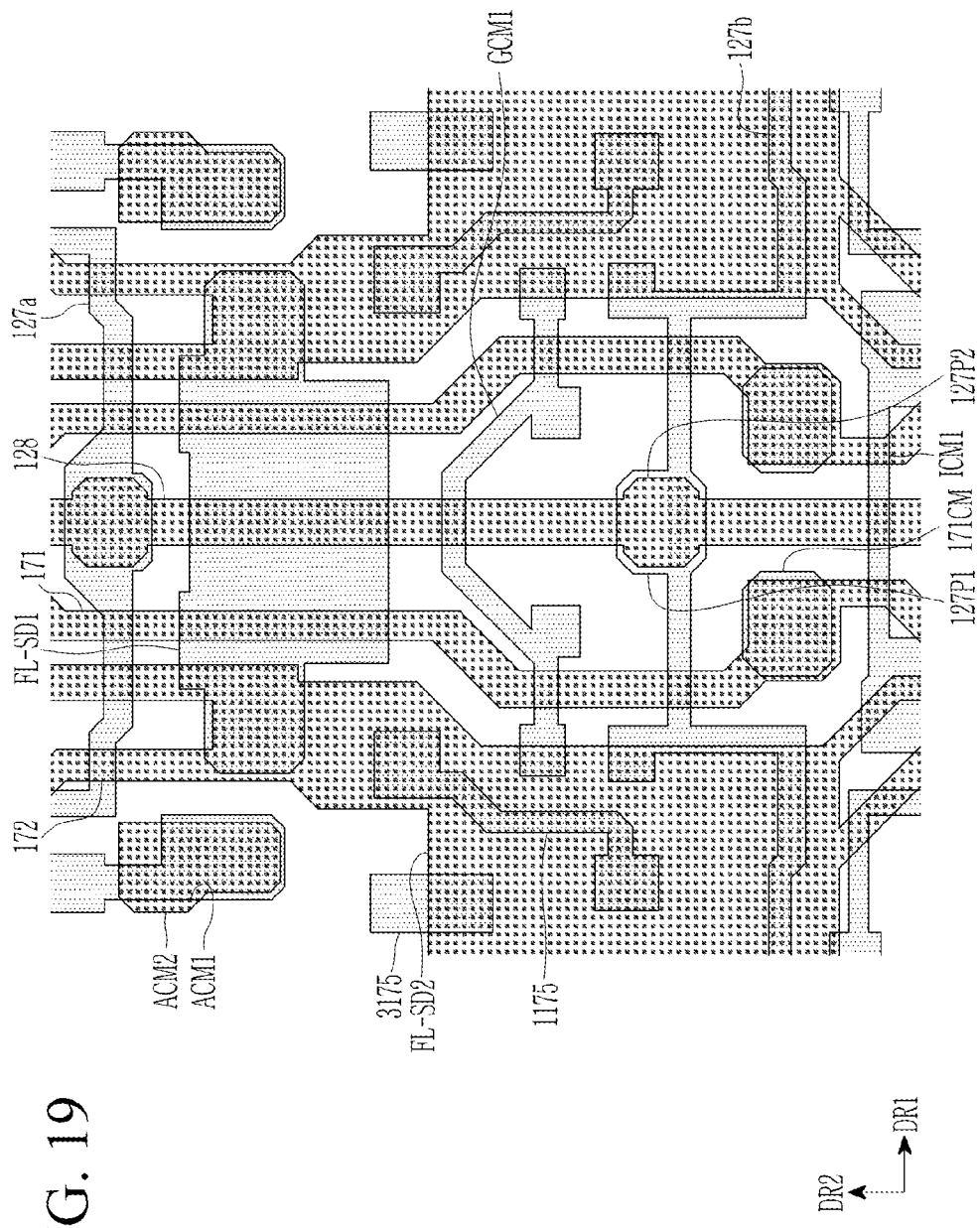
FIG. 19 is a plan view of a first data conductive layer and a second data conductive layer disposed in a display area.

Next, referring to FIGS. 18 and 19, a lower organic layer opening OP3 is defined in the first organic layer 181. A second data conductive layer including the second upper initialization voltage line 128, the data line 171, the driving voltage line 172, and the anode connection member ACM2 may be disposed on the first organic layer 181.

The lower organic layer opening OP3 may overlap with the connector 171CM, the anode connection member ACM1, the storage electrode connector FL-SD1, and the second lower initialization voltage line 128b disposed in the first data conductive layer to expose the connector 171CM, the anode connection member ACM1, the storage electrode connector FL-SD1, and the second lower initialization voltage line 128b, respectively.

The second data conductive layer may include the second upper initialization voltage line 128, the data line 171, the driving voltage line 172, and the anode connection member ACM2. The second upper initialization voltage line 128, the data line 171, and the driving voltage line 172 may be disposed over the plurality of pixel circuit regions PCR.

The second upper initialization voltage line 128, the data line 171, and the driving voltage line 172 may extend in a substantially vertical direction (the second direction DR2). The second upper initialization voltage line 128 is connected to the second lower initialization voltage line 127b through the lower organic layer opening OP3. The second upper initialization voltage line 128 may include a connection pad 127P2 in contact with a connection pad portion 127P1 of the second lower initialization voltage line 127b.

In addition, although not illustrated in the specification, a first upper initialization voltage line having the same shape as that of the second upper initialization voltage line may be disposed in another adjacent pixel circuit region. The first upper initialization voltage line may be connected to the first lower initialization voltage line 127a through a lower organic layer opening.

Each of the first upper initialization voltage line and the second upper initialization voltage line 128 may overlap with the valley V separating the pixel circuit regions PCR and the third insulating layer 163.

The data line 171 is connected to the connector 171CM of the first data conductive layer through the lower organic layer opening OP3 to be connected to the second transistor T2.

The driving voltage line 172 is electrically connected to the fifth transistor T5 and the first storage electrode 1153 through the storage electrode connector FL-SD1 of the first data conductive layer through the lower organic layer opening OP3. The anode connection member ACM2 is electrically connected to the anode connection member ACM1 of the first data conductive layer through the lower organic layer opening OP3 and is electrically connected to the sixth transistor T6.

The driving voltage line 172 may further include an extension FL-SD2 and has a structure which is not formed at a portion where the anode connection member ACM2 is formed. The extension FL-SD2 is substantially wide in order to planarize the anode disposed thereon. In the illustrated embodiment, the storage electrode connector FL-SD1 and the extension FL-SD2 are electrically connected to the driving voltage line 172 to transmit the driving voltage ELVDD.

The second data conductive layer SD2 may include a metal or a metal alloy such as aluminum (Al), copper (Cu), molybdenum (Mo), or titanium (Ti), and may be configured as a single layer or multi-layer.

Next, referring to FIG. 24, a second organic layer 182 and a third organic layer 183 are disposed on the second data conductive layer SD2. An anode is disposed on the third organic layer 183. The anode may receive a current from the pixel circuit unit through an anode connection opening OP4.

Referring to FIG. 20, the anode may further include an extension Anode-e to receive the current from the pixel circuit unit through the anode connection opening. The extension Anode-e in an embodiment may be electrically connected to the sixth transistor T6.

Referring to FIGS. 20 and 21, a pixel defining layer 380 is disposed on the anode. The pixel defining layer 380 in which an opening OP exposing the anode is defined and which covers at least a portion of the anode may be disposed on the anode. The pixel defining layer 380 may be a black pixel defining layer including a black organic material to prevent light applied from the outside from being reflected back to the outside and may also include a transparent organic material in some embodiments. Therefore, in an embodiment, the pixel defining layer 380 may include a negative-type black organic material and may include a black pigment.

In the embodiment, a portion exposed through at least the opening OP of the pixel defining layer 380 of the anode may be flatly formed by the extension FL-SD1 of the first data conductive layer and the extension FL-SD2 of the second data conductive layer disposed below the anode.

In addition, in an embodiment, at least one of the plurality of anodes may be disposed on the third insulating layer 163. At least one anode may overlap with the third insulating layer 163 having a cross shape in a plan view as illustrated in FIG. 21.

Referring to FIG. 24, a spacer 385 is disposed on the pixel defining layer 380. Unlike the pixel defining layer 380, the spacer 385 may include a transparent organic insulating material. In an embodiment, the spacer 385 may include a positive-type transparent organic material.

A functional layer FL and a cathode are sequentially formed on the anode, the spacer 385, and the pixel defining layer 380. A light-emitting layer EML is disposed between the functional layers FL, and the light-emitting layer EML may be disposed only in an opening OP of the pixel defining layer 380. Hereinafter, the functional layer FL and the light-emitting layer EML may be combined to be also referred to as an intermediate layer. The functional layer FL may include at least one of auxiliary layers such as an electron injection layer, an electron transport layer, a hole transport layer, and a hole injection layer. The hole injection layer and the hole transport layer may be disposed below the light-emitting layer EML, and the electron transport layer and the electron injection layer may be disposed above the light-emitting layer EML.

An encapsulation layer 400 is disposed on the cathode. The encapsulation layer 400 includes at least one inorganic layer and at least one organic layer and may have a triple-layered structure including a first inorganic encapsulation layer, an organic encapsulation layer, and a second inorganic encapsulation layer. The encapsulation layer 400 may be for protecting the light-emitting layer EML from moisture or oxygen that may be introduced from the outside. In an embodiment, the encapsulation layer 400 may include a structure in which the inorganic layer and the organic layer are sequentially further stacked.

For touch sensing, sensing insulating layers 501, 510, and 511 and a plurality of sensing electrodes 540 and 541 are disposed on the encapsulation layer 400. In the embodiment of FIG. 24, a touch may be sensed in a capacitive type using two sensing electrodes 540 and 541.

Specifically, the first sensing insulating layer 501 is formed on the encapsulation layer 400, and the plurality of sensing electrodes 540 and 541 are formed thereon. The plurality of sensing electrodes 540 and 541 may be insulated from each other with the second sensing insulating layer 510 interposed therebetween, and some thereof may be electrically connected through an opening defined in the sensing insulating layer 510. Here, the sensing electrodes 540 and 541 include a metal or a metal alloy such as aluminum (Al), copper (Cu), silver (Ag), gold (Au), molybdenum (Mo), titanium (Ti), or tantalum (Ta), and may be configured as a single layer or multi-layer. The third sensing insulating layer 511 is formed on the sensing electrode 540.

A light-blocking member 220 and a color filter layer 230 are disposed on the upper sensing electrode 540 and the third sensing insulating layer 511.

A light-blocking member 220 may be disposed to overlap with the sensing electrodes 540 and 541 in a plan view and may be disposed so as not to overlap with the anode in a plan view. This is, to prevent the anode capable of displaying an image from being covered by the light-blocking member 220 and the sensing electrodes 540 and 541.

The color filter layer 230 may be disposed on the third sensing insulating layer 511 and the light-blocking member 220. The color filter layer 230 includes a red color filter that transmits red light, a green color filter that transmits green light, and a blue color filter that transmits blue light. Each color filter layer 230 may be disposed so as to overlap with the anode of the light-emitting diode in a plan view. The light emitted from the light-emitting layer EML may be emitted while passing through a color filter to be changed to a corresponding color.

The light-blocking member 220 may be disposed between the color filter layers 230. In an embodiment, the color filter layer 230 may be replaced with a color conversion layer or may further include a color conversion layer. The color conversion layer may include quantum dots. In addition, in some embodiments, a reflection control layer filling an opening OPBM of the light-blocking member 220 may also be disposed instead of the color filter layer 230. The reflection control layer may also have a structure covering the light-blocking member 220.

A planarization layer 550 covering the color filter layer 230 may be disposed on the color filter layer 230.

A cross-sectional structure of the transmission unit OPS in the first component area EA1 is also illustrated in FIG. 24. The transmission unit OPS of the first component area EA1 may mean an area in which the semiconductor layer, the signal lines, the pixel defining layer 380, the light-blocking member 220, and the color filter layer 230 are not formed. Hereinafter, pixels disposed in the first component area EA1 will be described with reference to FIGS. 22 and 23. The configuration and arrangement of pixels disposed in the first component area EA1 may be substantially the same as those of pixels disposed in the display area DA, and only some components of the first data conductive layer and the second data conductive layer are different. Hereinafter, only the different components will be described in FIGS. 22 and 23. FIGS. 22 and 23 illustrate only the first data conductive layer and the second data conductive layer disposed in the first component area EA1, and configurations disposed below the first data conductive layer in a stacked structure may be the same as the components described with reference to FIGS. 9 to 16.

When describing the first data conductive layer with reference to FIG. 22, the second lower initialization voltage line 127b in an embodiment may not include a connection pad portion. The second lower initialization voltage line 127b may extend substantially in the first direction DR1 and does not include a separate connection pad portion. Referring to FIG. 19, one pixel included in the display area includes a second upper initialization voltage line 128 that is connected with the second lower initialization voltage line 127b and extends in the second direction DR2, as well as the second lower initialization voltage line 127b extending in the first direction DR1. However, one pixel included in the first component area may include only the second lower initialization voltage line 127b extending in the first direction DR1, and the second upper initialization voltage line and the connection pad portion may be omitted. According to such a simple structure, it is possible to reduce reflection of external light by lines.

In addition, the second data conductive layer disposed in the first component area EA1 may include the data line 171, the driving voltage line 172, and the anode connection member ACM2. The data line 171 in an embodiment may further include an extension FL-SD3 extending from a portion of the data line 171. The extension FL-SD3 extends from the data line 171 in the first direction DR1 to overlap with the storage electrode connector FL-SD1 and extends again in the second direction DR2 to overlap with the first initialization voltage line 127a. However, the invention is not limited thereto, and the extension FL-SD3 extending from a portion of the data line 171 may be omitted as illustrated in FIG. 23.

Compared to the embodiment of FIG. 19, one pixel disposed in the first component area may not include an upper initialization voltage line included in the second data conductive layer. Accordingly, the anode between the adjacent storage electrode connectors FL-SD1 may not be easily planarized. The data line 171 in an embodiment may help the planarization of the anode through the extension FL-SD3. The extended FL-SD3 may be deformed to allow any shape for achieving planarization of the anode.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
  a substrate including a display area and a component area, each of the display area and the component area including:
    a first semiconductor layer;
    a first gate conductive layer and a second gate conductive layer disposed on the first semiconductor layer;
    a second semiconductor layer disposed on the second gate conductive layer;
    a third gate conductive layer disposed on the second semiconductor layer;
    an insulating layer in which openings surrounding the first semiconductor layer, the second gate conductive layer, the second semiconductor layer and the third gate conductive layer are defined; and
    a first data conductive layer and a second data conductive layer disposed on the insulating layer; and
  a plurality of first signal lines and a plurality of second signal lines disposed on the substrate,
  wherein a first signal line of the plurality of first signal lines is included in the first data conductive layer and extends in a first direction,
  a second signal line of the plurality of second signal lines is included in the second data conductive layer and extends in a second direction perpendicular to the first direction, and
  the display area includes the first signal line and the second signal line and the component area includes the first signal line,
  wherein:
    the first semiconductor layer includes second transistors and fifth transistors, and a first distance between the second transistors spaced apart from each other with the insulating layer therebetween is greater than a second distance between the fifth transistors spaced apart from each other with the insulating layer therebetween.

2. The display device of claim 1, wherein:
  the component area does not include the second signal line.

3. The display device of claim 1, wherein:
in the display area, the first signal line and the second signal line are electrically connected to each other.

4. The display device of claim 3, wherein:
the first signal line disposed in the display area includes a connection pad portion in contact with the second signal line.

5. The display device of claim 1, further comprising a plurality of pixel circuit regions divided by the insulating layer,
wherein the second gate conductive layer includes a first storage electrode, a lower second scan line, and a lower initialization control line, and
the first storage electrode, the lower second scan line, and the lower initialization control line is spaced apart from each other by the insulating layer in adjacent pixel circuit regions, respectively, among the plurality of pixel circuit regions.

6. The display device of claim 5, wherein:
the second semiconductor layer includes a third transistor and a fourth transistor, and
the third gate conductive layer includes a gate electrode of the third transistor and a gate electrode of the fourth transistor.

7. The display device of claim 6, wherein:
the first data conductive layer includes:
 a second scan line connector connecting the lower second scan lines in the adjacent pixel circuit regions;
 an initialization connector connecting the lower initialization control lines in the adjacent pixel circuit regions; and
 a storage electrode connector connecting the first storage electrodes in the adjacent pixel circuit regions.

8. The display device of claim 6, wherein:
the first data conductive layer includes a lower initialization voltage line.

9. The display device of claim 8, wherein:
the second data conductive layer includes an upper initialization voltage line.

10. The display device of claim 9, wherein:
the display area includes the upper initialization voltage line, and the component area does not include the upper initialization voltage line.

11. The display device of claim 1, wherein:
the component area includes a third signal line connecting at least two first signal lines disposed along the second direction.

12. The display device of claim 11, wherein:
the third signal line connects some of the plurality of first signal lines disposed in the component area.

13. The display device of claim 12, wherein:
the first signal line is a lower initialization voltage line, and
the second signal line is an upper initialization voltage line.

14. The display device of claim 1, further comprising:
an anode disposed on the second data conductive layer,
wherein the anode at least partially overlaps with the insulating layer.

15. A display device comprising:
a substrate including a display area and a component area, each of the display area and the component area including:
a first semiconductor layer;
a gate conductive layer disposed on the first semiconductor layer;
an insulating layer in which openings surrounding the first semiconductor layer and the gate conductive layer are defined; and
a data conductive layer disposed on the insulating layer, the data conductive layer including:
at least one of a first signal line extending in a first direction and a second signal line extending in a second direction perpendicular to the first direction,
wherein the display area includes the first signal line and the second signal line, the component area includes the first signal line, and the second signal line overlaps with the insulating layer in the display area-,
wherein:
the data conductive layer includes a first data conductive layer and a second data conductive layer disposed in different layers, and
the first data conductive layer includes any one of the first signal line and the second signal line, and the second data conductive layer includes the other one of the first signal line and the second signal line.

16. The display device of claim 15, wherein:
the first signal line included in the display area includes a connection pad portion electrically connected to the second signal line.

17. The display device of claim 15, wherein:
the first signal line and the second signal line receive an initialization voltage or a power supply voltage.

18. The display device of claim 15, wherein:
the first signal line is provided in plural,
the component area includes a plurality of third signal lines connecting first signal lines adjacent along the second direction, and
the plurality of third signal lines is spaced apart from each other along the second direction.

* * * * *